(12) United States Patent
Kim et al.

(10) Patent No.: US 10,608,771 B2
(45) Date of Patent: Mar. 31, 2020

(54) APPARATUS AND METHOD FOR ENCODING AND DECODING USING SHORT-LENGTH BLOCK CODE IN WIRELESS COMMUNICATION SYSTEM

(71) Applicant: Samsung Electronics Co., Ltd, Suwon-si (KR)

(72) Inventors: Jaeyoel Kim, Seongnam-si (KR); Seokki Ahn, Suwon-si (KR); Min Jang, Seongnam-si (KR); Hongsil Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 45 days.

(21) Appl. No.: 15/934,426

(22) Filed: Mar. 23, 2018

(65) Prior Publication Data
US 2018/0278358 A1 Sep. 27, 2018

(30) Foreign Application Priority Data
Mar. 23, 2017 (KR) .................. 10-2017-0037172

(51) Int. Cl.
*H04J 13/00* (2011.01)
*H04B 1/707* (2011.01)
(Continued)

(52) U.S. Cl.
CPC ......... *H04J 13/0048* (2013.01); *H03M 13/00* (2013.01); *H03M 13/136* (2013.01);
(Continued)

(58) Field of Classification Search
CPC .... H04J 13/0048; H04J 13/0003; H04J 13/12; H03M 13/618; H03M 13/136;
(Continued)

(56) References Cited

U.S. PATENT DOCUMENTS

| 8,745,459 B2* | 6/2014 | Roh | ...................... H03M 13/05 714/752 |
| 8,793,550 B2* | 7/2014 | Roh | ...................... H03M 13/033 714/752 |

(Continued)

OTHER PUBLICATIONS

Samsung, TFCI Coding Scheme for 8PSK in low chip rate TDD Option, Aug. 25, 2000 (Year: 2000).*

*Primary Examiner* — Tejis Daya

(57) ABSTRACT

The present disclosure relates to a communication method and system for converging a 5th-Generation (5G) communication system for supporting higher data rates beyond a 4th-Generation (4G) system with a technology for Internet of Things (IoT). The present disclosure may be applied to intelligent services based on the 5G communication technology and the IoT-related technology, such as smart home, smart building, smart city, smart car, connected car, health care, digital education, smart retail, security and safety services. In an embodiment, a method for encoding information bits includes receiving the information bits, encoding the information bits by using a block code, and outputting a codeword generated as a result of the encoding. A length of the information bits is a maximum of 13 bits, and the block code is composed of a Walsh basis sequence and a mask basis sequence.

18 Claims, 17 Drawing Sheets

(51) Int. Cl.
  *H04L 1/00* (2006.01)
  *H03M 13/00* (2006.01)
  *H03M 13/13* (2006.01)
  *H04J 13/12* (2011.01)

(52) U.S. Cl.
  CPC ....... *H03M 13/616* (2013.01); *H03M 13/618* (2013.01); *H04B 1/707* (2013.01); *H04J 13/0003* (2013.01); *H04L 1/0041* (2013.01); *H04L 1/0057* (2013.01); *H04J 13/12* (2013.01)

(58) Field of Classification Search
  CPC ... H03M 13/616; H03M 13/00; H04L 1/0041; H04L 1/0057; H04B 1/707
  See application file for complete search history.

(56) References Cited

U.S. PATENT DOCUMENTS

| | | | | |
|---|---|---|---|---|
| 9,104,589 | B1 * | 8/2015 | Landon | H03M 13/1137 |
| 2001/0034871 | A1 * | 10/2001 | Takeda | H03M 13/136 714/781 |
| 2002/0013926 | A1 * | 1/2002 | Kim | H04L 1/0069 714/781 |
| 2002/0154618 | A1 * | 10/2002 | Kim | H04L 1/0041 370/342 |
| 2002/0162073 | A1 * | 10/2002 | Choi | H04B 1/7075 714/779 |
| 2005/0083901 | A1 * | 4/2005 | Kim | H03M 13/136 370/342 |
| 2005/0232142 | A1 * | 10/2005 | Balasubramanian | H04J 13/0048 370/209 |
| 2006/0077947 | A1 * | 4/2006 | Kim | H04L 1/0041 370/349 |
| 2008/0040649 | A1 * | 2/2008 | Lundby | H03M 13/27 714/776 |
| 2008/0141104 | A1 * | 6/2008 | Miyazaki | H03M 13/2903 714/801 |
| 2010/0115380 | A1 | 5/2010 | Chang et al. | |

* cited by examiner

FIG. 2

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ |
|---|---|---|---|---|---|---|---|---|---|---|---|
| 0 | 1 | 1 | 0 | 0 | 0 | 0 | 0 | 0 | 0 | 0 | 1 |
| 1 | 1 | 1 | 1 | 0 | 0 | 0 | 0 | 0 | 0 | 1 | 1 |
| 2 | 1 | 0 | 0 | 1 | 0 | 0 | 1 | 0 | 1 | 1 | 1 |
| 3 | 1 | 0 | 1 | 1 | 0 | 0 | 0 | 0 | 1 | 0 | 1 |
| 4 | 1 | 1 | 1 | 1 | 0 | 0 | 0 | 1 | 0 | 0 | 1 |
| 5 | 1 | 1 | 0 | 0 | 1 | 0 | 1 | 1 | 1 | 0 | 1 |
| 6 | 1 | 0 | 1 | 0 | 1 | 0 | 1 | 0 | 1 | 1 | 1 |
| 7 | 1 | 0 | 0 | 1 | 1 | 0 | 0 | 1 | 1 | 0 | 1 |
| 8 | 1 | 1 | 0 | 1 | 1 | 0 | 0 | 1 | 0 | 1 | 1 |
| 9 | 1 | 0 | 1 | 1 | 1 | 0 | 1 | 0 | 0 | 1 | 1 |
| 10 | 1 | 0 | 1 | 0 | 0 | 1 | 1 | 1 | 0 | 1 | 1 |
| 11 | 1 | 1 | 1 | 0 | 0 | 1 | 1 | 0 | 1 | 0 | 1 |
| 12 | 1 | 0 | 0 | 1 | 0 | 1 | 0 | 1 | 1 | 1 | 1 |
| 13 | 1 | 1 | 0 | 1 | 0 | 1 | 0 | 1 | 0 | 1 | 1 |
| 14 | 1 | 0 | 0 | 0 | 1 | 1 | 0 | 1 | 0 | 0 | 1 |
| 15 | 1 | 1 | 0 | 0 | 1 | 1 | 1 | 1 | 0 | 1 | 1 |
| 16 | 1 | 1 | 1 | 0 | 1 | 1 | 1 | 0 | 0 | 1 | 0 |
| 17 | 1 | 0 | 0 | 1 | 1 | 1 | 0 | 0 | 1 | 0 | 0 |
| 18 | 1 | 1 | 0 | 1 | 1 | 1 | 1 | 1 | 0 | 0 | 0 |
| 19 | 1 | 0 | 0 | 0 | 0 | 1 | 1 | 0 | 0 | 0 | 0 |
| 20 | 1 | 0 | 1 | 0 | 0 | 0 | 1 | 0 | 0 | 0 | 1 |
| 21 | 1 | 1 | 0 | 1 | 0 | 0 | 0 | 0 | 0 | 1 | 1 |
| 22 | 1 | 0 | 0 | 0 | 1 | 0 | 0 | 1 | 1 | 0 | 1 |
| 23 | 1 | 1 | 1 | 0 | 1 | 0 | 0 | 0 | 1 | 1 | 1 |
| 24 | 1 | 1 | 1 | 1 | 1 | 0 | 1 | 1 | 1 | 1 | 0 |
| 25 | 1 | 1 | 0 | 0 | 0 | 1 | 1 | 1 | 0 | 0 | 1 |
| 26 | 1 | 0 | 1 | 1 | 0 | 1 | 0 | 0 | 1 | 1 | 0 |
| 27 | 1 | 1 | 1 | 1 | 0 | 1 | 0 | 1 | 1 | 1 | 0 |
| 28 | 1 | 0 | 1 | 0 | 1 | 1 | 1 | 0 | 1 | 0 | 0 |
| 29 | 1 | 0 | 1 | 1 | 1 | 1 | 1 | 1 | 1 | 0 | 0 |
| 30 | 1 | 1 | 1 | 1 | 1 | 1 | 1 | 1 | 1 | 1 | 1 |
| 31 | 1 | 0 | 0 | 0 | 0 | 0 | 0 | 0 | 0 | 0 | 0 |

FIG. 4

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0  | 1 | 1 | 0 | 0 | 0 | 0 | 0 | 0 | 0 | 0 | 1 | 1 | 0 |
| 1  | 1 | 1 | 1 | 0 | 0 | 0 | 0 | 0 | 0 | 1 | 1 | 1 | 0 |
| 2  | 1 | 0 | 0 | 1 | 0 | 0 | 1 | 0 | 1 | 1 | 1 | 1 | 1 |
| 3  | 1 | 0 | 1 | 1 | 0 | 0 | 0 | 0 | 0 | 0 | 1 | 1 | 1 |
| 4  | 1 | 1 | 1 | 1 | 1 | 0 | 1 | 1 | 1 | 0 | 1 | 1 | 1 |
| 5  | 1 | 1 | 0 | 0 | 1 | 0 | 0 | 0 | 1 | 1 | 1 | 1 | 1 |
| 6  | 1 | 0 | 1 | 0 | 1 | 0 | 0 | 0 | 1 | 0 | 1 | 1 | 1 |
| 7  | 1 | 0 | 0 | 1 | 1 | 0 | 0 | 1 | 0 | 1 | 1 | 1 | 1 |
| 8  | 1 | 1 | 0 | 1 | 1 | 0 | 1 | 0 | 0 | 0 | 1 | 1 | 1 |
| 9  | 1 | 0 | 1 | 0 | 0 | 0 | 0 | 1 | 0 | 1 | 1 | 1 | 1 |
| 10 | 1 | 0 | 0 | 0 | 0 | 1 | 0 | 0 | 1 | 1 | 1 | 1 | 1 |
| 11 | 1 | 1 | 1 | 1 | 0 | 1 | 1 | 1 | 1 | 0 | 1 | 1 | 1 |
| 12 | 1 | 0 | 0 | 0 | 0 | 1 | 0 | 1 | 0 | 1 | 1 | 1 | 1 |
| 13 | 1 | 1 | 0 | 0 | 1 | 1 | 1 | 1 | 0 | 1 | 1 | 1 | 1 |
| 14 | 1 | 0 | 0 | 0 | 1 | 1 | 0 | 0 | 0 | 0 | 1 | 1 | 1 |
| 15 | 1 | 1 | 1 | 1 | 1 | 1 | 1 | 0 | 0 | 1 | 1 | 1 | 1 |
| 16 | 1 | 1 | 0 | 1 | 1 | 1 | 0 | 0 | 1 | 0 | 0 | 0 | 1 |
| 17 | 1 | 0 | 0 | 1 | 1 | 1 | 1 | 1 | 0 | 0 | 0 | 1 | 1 |
| 18 | 1 | 1 | 0 | 1 | 1 | 1 | 0 | 1 | 1 | 0 | 0 | 0 | 0 |
| 19 | 1 | 0 | 0 | 0 | 0 | 1 | 1 | 0 | 0 | 0 | 0 | 0 | 0 |

FIG. 10A

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 1 | 1 | 0 | 0 | 0 | 1 | 1 | 1 |
| 1 | 0 | 1 | 0 | 0 | 0 | 1 | 1 | 1 | 0 | 0 | 0 | 1 | 1 |
| 2 | 1 | 0 | 1 | 0 | 0 | 1 | 1 | 0 | 0 | 1 | 1 | 0 | 0 |
| 3 | 0 | 0 | 1 | 0 | 0 | 1 | 1 | 1 | 1 | 0 | 0 | 1 | 0 |
| 4 | 0 | 1 | 1 | 0 | 0 | 1 | 0 | 1 | 0 | 0 | 0 | 0 | 0 |
| 5 | 1 | 1 | 1 | 0 | 0 | 1 | 1 | 1 | 1 | 1 | 0 | 0 | 0 |
| 6 | 1 | 0 | 0 | 1 | 0 | 1 | 0 | 1 | 1 | 1 | 0 | 0 | 1 |
| 7 | 1 | 1 | 0 | 1 | 0 | 1 | 1 | 1 | 0 | 0 | 1 | 0 | 0 |
| 8 | 1 | 0 | 1 | 1 | 0 | 1 | 0 | 0 | 1 | 0 | 0 | 1 | 0 |
| 9 | 0 | 1 | 1 | 1 | 0 | 1 | 1 | 0 | 1 | 0 | 0 | 0 | 0 |
| 10 | 0 | 0 | 0 | 0 | 1 | 1 | 0 | 0 | 0 | 0 | 1 | 0 | 0 |
| 11 | 1 | 0 | 0 | 0 | 1 | 1 | 0 | 0 | 0 | 1 | 0 | 0 | 0 |
| 12 | 0 | 0 | 1 | 0 | 1 | 1 | 0 | 0 | 1 | 1 | 0 | 0 | 0 |
| 13 | 1 | 0 | 1 | 0 | 1 | 1 | 1 | 1 | 0 | 1 | 0 | 0 | 0 |
| 14 | 0 | 1 | 1 | 0 | 1 | 1 | 0 | 1 | 1 | 0 | 0 | 0 | 0 |
| 15 | 1 | 1 | 1 | 0 | 1 | 1 | 0 | 1 | 0 | 0 | 1 | 0 | 1 |
| 16 | 1 | 0 | 0 | 1 | 1 | 1 | 1 | 1 | 0 | 1 | 1 | 0 | 0 |
| 17 | 1 | 1 | 0 | 1 | 1 | 1 | 1 | 0 | 0 | 1 | 0 | 0 | 0 |
| 18 | 0 | 0 | 1 | 1 | 1 | 1 | 0 | 1 | 0 | 1 | 1 | 0 | 0 |
| 19 | 1 | 1 | 1 | 1 | 1 | 1 | 0 | 1 | 1 | 1 | 1 | 0 | 0 |
| 20 | 0 | 0 | 0 | 0 | 0 | 1 | 0 | 0 | 0 | 0 | 0 | 0 | 0 |
| 21 | 1 | 0 | 0 | 0 | 0 | 1 | 1 | 0 | 0 | 0 | 0 | 0 | 0 |
| 22 | 0 | 0 | 0 | 1 | 0 | 1 | 0 | 0 | 0 | 1 | 1 | 0 | 0 |
| 23 | 0 | 1 | 0 | 1 | 0 | 1 | 0 | 1 | 1 | 0 | 1 | 0 | 0 |
| 24 | 0 | 0 | 1 | 1 | 0 | 1 | 1 | 0 | 1 | 1 | 0 | 0 | 0 |
| 25 | 1 | 1 | 1 | 1 | 0 | 1 | 1 | 1 | 1 | 1 | 1 | 0 | 0 |
| 26 | 0 | 1 | 0 | 0 | 1 | 1 | 0 | 0 | 1 | 1 | 1 | 0 | 0 |
| 27 | 1 | 1 | 0 | 0 | 1 | 1 | 1 | 1 | 1 | 0 | 1 | 0 | 0 |
| 28 | 0 | 0 | 0 | 1 | 1 | 1 | 0 | 0 | 1 | 0 | 1 | 0 | 0 |
| 29 | 0 | 1 | 0 | 1 | 1 | 1 | 1 | 0 | 1 | 0 | 1 | 0 | 0 |
| 30 | 1 | 0 | 1 | 1 | 1 | 1 | 0 | 1 | 0 | 1 | 0 | 0 | 0 |
| 31 | 0 | 1 | 1 | 1 | 1 | 1 | 1 | 0 | 1 | 1 | 1 | 0 | 0 |

FIG. 10B

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 1 | 1 | 0 | 0 | 0 | 1 | 1 | 1 |
| 1 | 0 | 1 | 0 | 0 | 0 | 1 | 1 | 1 | 0 | 0 | 0 | 1 | 1 |
| 2 | 1 | 0 | 1 | 0 | 0 | 1 | 1 | 0 | 0 | 1 | 1 | 0 | 0 |
| 3 | 0 | 0 | 1 | 0 | 0 | 1 | 1 | 1 | 1 | 0 | 0 | 1 | 0 |
| 4 | 0 | 1 | 1 | 0 | 0 | 1 | 0 | 1 | 0 | 0 | 0 | 0 | 0 |
| 5 | 1 | 1 | 1 | 0 | 0 | 1 | 1 | 1 | 1 | 1 | 0 | 0 | 0 |
| 6 | 1 | 0 | 0 | 1 | 0 | 1 | 0 | 1 | 1 | 1 | 0 | 0 | 1 |
| 7 | 1 | 1 | 0 | 1 | 0 | 1 | 1 | 1 | 0 | 0 | 1 | 0 | 0 |
| 8 | 1 | 0 | 1 | 1 | 0 | 1 | 0 | 0 | 1 | 0 | 0 | 1 | 0 |
| 9 | 0 | 1 | 1 | 1 | 0 | 1 | 1 | 0 | 1 | 0 | 0 | 0 | 0 |
| 10 | 0 | 0 | 0 | 0 | 1 | 1 | 0 | 0 | 0 | 0 | 1 | 0 | 0 |
| 11 | 1 | 0 | 0 | 0 | 1 | 1 | 0 | 0 | 0 | 1 | 0 | 0 | 0 |
| 12 | 0 | 0 | 1 | 0 | 1 | 1 | 0 | 0 | 1 | 1 | 0 | 0 | 0 |
| 13 | 1 | 0 | 1 | 0 | 1 | 1 | 1 | 1 | 0 | 1 | 0 | 0 | 0 |
| 14 | 0 | 1 | 1 | 0 | 1 | 1 | 0 | 1 | 1 | 0 | 0 | 0 | 0 |
| 15 | 1 | 1 | 1 | 0 | 1 | 1 | 0 | 1 | 0 | 0 | 1 | 0 | 1 |
| 16 | 1 | 0 | 0 | 1 | 1 | 1 | 1 | 1 | 0 | 1 | 1 | 0 | 0 |
| 17 | 1 | 1 | 0 | 1 | 1 | 1 | 1 | 0 | 0 | 1 | 0 | 0 | 0 |
| 18 | 0 | 0 | 1 | 1 | 1 | 1 | 0 | 1 | 0 | 1 | 1 | 0 | 0 |
| 19 | 1 | 1 | 1 | 1 | 1 | 1 | 0 | 1 | 1 | 1 | 1 | 0 | 0 |
| 20 | 0 | 0 | 0 | 0 | 0 | 1 | 0 | 0 | 0 | 0 | 0 | 0 | 0 |
| 21 | 1 | 0 | 0 | 0 | 0 | 1 | 1 | 0 | 0 | 0 | 0 | 0 | 0 |
| 22 | 0 | 0 | 0 | 1 | 0 | 1 | 0 | 0 | 0 | 1 | 1 | 0 | 0 |
| 23 | 0 | 1 | 0 | 1 | 0 | 1 | 0 | 1 | 1 | 0 | 1 | 0 | 0 |
| 24 | 0 | 0 | 1 | 1 | 0 | 1 | 1 | 0 | 1 | 1 | 0 | 0 | 0 |
| 25 | 1 | 1 | 1 | 1 | 0 | 1 | 1 | 1 | 1 | 1 | 1 | 0 | 0 |
| 26 | 0 | 1 | 0 | 0 | 1 | 1 | 0 | 0 | 1 | 1 | 1 | 0 | 0 |
| 27 | 1 | 1 | 0 | 0 | 1 | 1 | 1 | 1 | 1 | 0 | 1 | 0 | 0 |
| 28 | 0 | 0 | 0 | 1 | 1 | 1 | 0 | 0 | 1 | 0 | 1 | 0 | 0 |
| 29 | 0 | 1 | 0 | 1 | 1 | 1 | 1 | 0 | 1 | 0 | 1 | 0 | 0 |
| 30 | 1 | 0 | 1 | 1 | 1 | 1 | 0 | 1 | 0 | 1 | 0 | 0 | 0 |
| 31 | 0 | 1 | 1 | 1 | 1 | 1 | 1 | 0 | 1 | 1 | 1 | 0 | 0 |

FIG. 10C

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 1 | 1 | 0 | 0 | 0 | 1 | 1 | 1 |
| 1 | 0 | 1 | 0 | 0 | 0 | 1 | 1 | 1 | 0 | 0 | 0 | 1 | 1 |
| 2 | 1 | 0 | 1 | 0 | 0 | 1 | 1 | 0 | 0 | 1 | 1 | 0 | 0 |
| 3 | 0 | 0 | 1 | 0 | 0 | 1 | 1 | 1 | 1 | 0 | 0 | 1 | 0 |
| 4 | 0 | 1 | 1 | 0 | 0 | 1 | 0 | 1 | 0 | 0 | 0 | 0 | 0 |
| 5 | 1 | 1 | 1 | 0 | 0 | 1 | 1 | 1 | 1 | 1 | 0 | 0 | 0 |
| 6 | 1 | 0 | 0 | 1 | 0 | 1 | 0 | 1 | 1 | 1 | 0 | 0 | 1 |
| 7 | 1 | 1 | 0 | 1 | 0 | 1 | 1 | 1 | 0 | 0 | 1 | 0 | 0 |
| 8 | 1 | 0 | 1 | 1 | 0 | 1 | 0 | 0 | 1 | 0 | 0 | 1 | 0 |
| 9 | 0 | 1 | 1 | 1 | 0 | 1 | 1 | 0 | 1 | 0 | 0 | 0 | 0 |
| 10 | 0 | 0 | 0 | 0 | 1 | 1 | 0 | 0 | 0 | 0 | 1 | 0 | 0 |
| 11 | 1 | 0 | 0 | 0 | 1 | 1 | 0 | 0 | 0 | 1 | 0 | 0 | 0 |
| 12 | 0 | 0 | 1 | 0 | 1 | 1 | 0 | 0 | 1 | 1 | 0 | 0 | 0 |
| 13 | 1 | 0 | 1 | 0 | 1 | 1 | 1 | 1 | 0 | 1 | 0 | 0 | 0 |
| 14 | 0 | 1 | 1 | 0 | 1 | 1 | 0 | 1 | 1 | 0 | 0 | 0 | 0 |
| 15 | 1 | 1 | 1 | 0 | 1 | 1 | 0 | 1 | 0 | 0 | 1 | 0 | 1 |
| 16 | 1 | 0 | 0 | 1 | 1 | 1 | 1 | 1 | 0 | 1 | 1 | 0 | 0 |
| 17 | 1 | 1 | 0 | 1 | 1 | 1 | 1 | 0 | 0 | 1 | 0 | 0 | 0 |
| 18 | 0 | 0 | 1 | 1 | 1 | 1 | 0 | 1 | 0 | 1 | 1 | 0 | 0 |
| 19 | 1 | 1 | 1 | 1 | 1 | 1 | 0 | 1 | 1 | 1 | 1 | 0 | 0 |
| 20 | 0 | 0 | 0 | 0 | 0 | 1 | 0 | 0 | 0 | 0 | 0 | 0 | 0 |
| 21 | 1 | 0 | 0 | 0 | 0 | 1 | 1 | 0 | 0 | 0 | 0 | 0 | 0 |
| 22 | 0 | 0 | 0 | 1 | 0 | 1 | 0 | 0 | 0 | 1 | 1 | 0 | 0 |
| 23 | 0 | 1 | 0 | 1 | 0 | 1 | 0 | 1 | 1 | 0 | 1 | 0 | 0 |
| 24 | 0 | 0 | 1 | 1 | 0 | 1 | 1 | 0 | 1 | 1 | 0 | 0 | 0 |
| 25 | 1 | 1 | 1 | 1 | 0 | 1 | 1 | 1 | 1 | 1 | 1 | 0 | 0 |
| 26 | 0 | 1 | 0 | 0 | 1 | 1 | 0 | 0 | 1 | 1 | 1 | 0 | 0 |
| 27 | 1 | 1 | 0 | 0 | 1 | 1 | 1 | 1 | 1 | 0 | 1 | 0 | 0 |
| 28 | 0 | 0 | 0 | 1 | 1 | 1 | 0 | 0 | 1 | 0 | 1 | 0 | 0 |
| 29 | 0 | 1 | 0 | 1 | 1 | 1 | 1 | 0 | 1 | 0 | 1 | 0 | 0 |
| 30 | 1 | 0 | 1 | 1 | 1 | 1 | 0 | 1 | 0 | 1 | 0 | 0 | 0 |
| 31 | 0 | 1 | 1 | 1 | 1 | 1 | 1 | 0 | 1 | 1 | 1 | 0 | 0 |

FIG. 10D

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 1 | 1 | 0 | 0 | 0 | 1 | 1 | 1 |
| 1 | 0 | 1 | 0 | 0 | 0 | 1 | 1 | 1 | 0 | 0 | 0 | 1 | 1 |
| 2 | 1 | 0 | 1 | 0 | 0 | 1 | 1 | 0 | 0 | 1 | 1 | 0 | 0 |
| 3 | 0 | 0 | 1 | 0 | 0 | 1 | 1 | 1 | 1 | 0 | 0 | 1 | 0 |
| 4 | 0 | 1 | 1 | 0 | 0 | 1 | 0 | 1 | 0 | 0 | 0 | 0 | 0 |
| 5 | 1 | 1 | 1 | 0 | 0 | 1 | 1 | 1 | 1 | 1 | 0 | 0 | 0 |
| 6 | 1 | 0 | 0 | 1 | 0 | 1 | 0 | 1 | 1 | 1 | 0 | 0 | 1 |
| 7 | 1 | 1 | 0 | 1 | 0 | 1 | 1 | 1 | 0 | 0 | 1 | 0 | 0 |
| 8 | 1 | 0 | 1 | 1 | 0 | 1 | 0 | 0 | 1 | 0 | 0 | 1 | 0 |
| 9 | 0 | 1 | 1 | 1 | 0 | 1 | 1 | 0 | 1 | 0 | 0 | 0 | 0 |
| 10 | 0 | 0 | 0 | 0 | 1 | 1 | 0 | 0 | 0 | 0 | 1 | 0 | 0 |
| 11 | 1 | 0 | 0 | 0 | 1 | 1 | 0 | 0 | 0 | 1 | 0 | 0 | 0 |
| 12 | 0 | 0 | 1 | 0 | 1 | 1 | 0 | 0 | 1 | 1 | 0 | 0 | 0 |
| 13 | 1 | 0 | 1 | 0 | 1 | 1 | 1 | 1 | 0 | 1 | 0 | 0 | 0 |
| 14 | 0 | 1 | 1 | 0 | 1 | 1 | 0 | 1 | 1 | 0 | 0 | 0 | 0 |
| 15 | 1 | 1 | 1 | 0 | 1 | 1 | 0 | 1 | 0 | 0 | 1 | 0 | 1 |
| 16 | 1 | 0 | 0 | 1 | 1 | 1 | 1 | 1 | 0 | 1 | 1 | 0 | 0 |
| 17 | 1 | 1 | 0 | 1 | 1 | 1 | 1 | 0 | 0 | 1 | 0 | 0 | 0 |
| 18 | 0 | 0 | 1 | 1 | 1 | 1 | 0 | 1 | 0 | 1 | 1 | 0 | 0 |
| 19 | 1 | 1 | 1 | 1 | 1 | 1 | 0 | 1 | 1 | 1 | 1 | 0 | 0 |
| 20 | 0 | 0 | 0 | 0 | 0 | 1 | 0 | 0 | 0 | 0 | 0 | 0 | 0 |
| 21 | 1 | 0 | 0 | 0 | 0 | 1 | 1 | 0 | 0 | 0 | 0 | 0 | 0 |
| 22 | 0 | 0 | 0 | 1 | 0 | 1 | 0 | 0 | 0 | 1 | 1 | 0 | 0 |
| 23 | 0 | 1 | 0 | 1 | 0 | 1 | 0 | 1 | 1 | 0 | 1 | 0 | 0 |
| 24 | 0 | 0 | 1 | 1 | 0 | 1 | 1 | 0 | 1 | 1 | 0 | 0 | 0 |
| 25 | 1 | 1 | 1 | 1 | 0 | 1 | 1 | 1 | 1 | 1 | 1 | 0 | 0 |
| 26 | 0 | 1 | 0 | 0 | 1 | 1 | 0 | 0 | 1 | 1 | 1 | 0 | 0 |
| 27 | 1 | 1 | 0 | 0 | 1 | 1 | 1 | 1 | 1 | 0 | 1 | 0 | 0 |
| 28 | 0 | 0 | 0 | 1 | 1 | 1 | 0 | 0 | 1 | 0 | 1 | 0 | 0 |
| 29 | 0 | 1 | 0 | 1 | 1 | 1 | 1 | 0 | 1 | 0 | 1 | 0 | 0 |
| 30 | 1 | 0 | 1 | 1 | 1 | 1 | 0 | 1 | 0 | 1 | 0 | 0 | 0 |
| 31 | 0 | 1 | 1 | 1 | 1 | 1 | 1 | 0 | 1 | 1 | 1 | 0 | 0 |

FIG. 10E

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 1 | 1 | 0 | 0 | 0 | 1 | 1 | 1 |
| 1 | 0 | 1 | 0 | 0 | 0 | 1 | 1 | 1 | 0 | 0 | 0 | 1 | 1 |
| 2 | 1 | 0 | 1 | 0 | 0 | 1 | 1 | 0 | 0 | 1 | 1 | 0 | 0 |
| 3 | 0 | 0 | 1 | 0 | 0 | 1 | 1 | 1 | 1 | 0 | 0 | 1 | 0 |
| 4 | 0 | 1 | 1 | 0 | 0 | 1 | 0 | 1 | 0 | 0 | 0 | 0 | 0 |
| 5 | 1 | 1 | 1 | 0 | 0 | 1 | 1 | 1 | 1 | 1 | 0 | 0 | 0 |
| 6 | 1 | 0 | 0 | 1 | 0 | 1 | 0 | 1 | 1 | 1 | 0 | 0 | 1 |
| 7 | 1 | 1 | 0 | 1 | 0 | 1 | 1 | 1 | 0 | 0 | 1 | 0 | 0 |
| 8 | 1 | 0 | 1 | 1 | 0 | 1 | 0 | 0 | 1 | 0 | 0 | 1 | 0 |
| 9 | 0 | 1 | 1 | 1 | 0 | 1 | 1 | 0 | 1 | 0 | 0 | 0 | 0 |
| 10 | 0 | 0 | 0 | 0 | 1 | 1 | 0 | 0 | 0 | 0 | 1 | 0 | 0 |
| 11 | 1 | 0 | 0 | 0 | 1 | 1 | 0 | 0 | 0 | 1 | 0 | 0 | 0 |
| 12 | 0 | 0 | 1 | 0 | 1 | 1 | 0 | 0 | 1 | 1 | 0 | 0 | 0 |
| 13 | 1 | 0 | 1 | 0 | 1 | 1 | 1 | 1 | 0 | 1 | 0 | 0 | 0 |
| 14 | 0 | 1 | 1 | 0 | 1 | 1 | 0 | 1 | 1 | 0 | 0 | 0 | 0 |
| 15 | 1 | 1 | 1 | 0 | 1 | 1 | 0 | 1 | 0 | 0 | 1 | 0 | 1 |
| 16 | 1 | 0 | 0 | 1 | 1 | 1 | 1 | 1 | 0 | 1 | 1 | 0 | 0 |
| 17 | 1 | 1 | 0 | 1 | 1 | 1 | 1 | 0 | 0 | 1 | 0 | 0 | 0 |
| 18 | 0 | 0 | 1 | 1 | 1 | 1 | 0 | 1 | 0 | 1 | 1 | 0 | 0 |
| 19 | 1 | 1 | 1 | 1 | 1 | 1 | 0 | 1 | 1 | 1 | 1 | 0 | 0 |
| 20 | 0 | 0 | 0 | 0 | 0 | 1 | 0 | 0 | 0 | 0 | 0 | 0 | 0 |
| 21 | 1 | 0 | 0 | 0 | 0 | 1 | 1 | 0 | 0 | 0 | 0 | 0 | 0 |
| 22 | 0 | 0 | 0 | 1 | 0 | 1 | 0 | 0 | 0 | 1 | 1 | 0 | 0 |
| 23 | 0 | 1 | 0 | 1 | 0 | 1 | 0 | 1 | 1 | 0 | 1 | 0 | 0 |
| 24 | 0 | 0 | 1 | 1 | 0 | 1 | 1 | 0 | 1 | 1 | 0 | 0 | 0 |
| 25 | 1 | 1 | 1 | 1 | 0 | 1 | 1 | 1 | 1 | 1 | 1 | 0 | 0 |
| 26 | 0 | 1 | 0 | 0 | 1 | 1 | 0 | 0 | 1 | 1 | 1 | 0 | 0 |
| 27 | 1 | 1 | 0 | 0 | 1 | 1 | 1 | 1 | 1 | 0 | 1 | 0 | 0 |
| 28 | 0 | 0 | 0 | 1 | 1 | 1 | 0 | 0 | 1 | 0 | 1 | 0 | 0 |
| 29 | 0 | 1 | 0 | 1 | 1 | 1 | 1 | 0 | 1 | 0 | 1 | 0 | 0 |
| 30 | 1 | 0 | 1 | 1 | 1 | 1 | 0 | 1 | 0 | 1 | 0 | 0 | 0 |
| 31 | 0 | 1 | 1 | 1 | 1 | 1 | 1 | 0 | 1 | 1 | 1 | 0 | 0 |

APPARATUS AND METHOD FOR ENCODING AND DECODING USING SHORT-LENGTH BLOCK CODE IN WIRELESS COMMUNICATION SYSTEM

CROSS-REFERENCE TO RELATED APPLICATION AND CLAIM OF PRIORITY

This application is based on and claims priority under 35 U.S.C. § 119 to Korean Patent Application No. 10-2017-0037172 filed on Mar. 23, 2017 in the Korean Intellectual Property Office, the disclosure of which is incorporated herein by reference in its entirety.

TECHNICAL FIELD

The present disclosure relates to a method and apparatus for encoding and decoding using a short-length block code in a wireless communication system.

BACKGROUND

To meet the demand for wireless data traffic having increased since deployment of 4G communication systems, efforts have been made to develop an improved 5G or pre-5G communication system. Therefore, the 5G or pre-5G communication system is also called a 'Beyond 4G Network' or a 'Post LTE System'. The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems. In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like. In the 5G system, Hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

The Internet, which is a human centered connectivity network where humans generate and consume information, is now evolving to the Internet of Things (IoT) where distributed entities, such as things, exchange and process information without human intervention. The Internet of Everything (IoE), which is a combination of the IoT technology and the Big Data processing technology through connection with a cloud server, has emerged. As technology elements, such as "sensing technology", "wired/wireless communication and network infrastructure", "service interface technology", and "Security technology" have been demanded for IoT implementation, a sensor network, a Machine-to-Machine (M2M) communication, Machine Type Communication (MTC), and so forth have been recently researched. Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing Information Technology (IT) and various industrial applications.

In line with this, various attempts have been made to apply 5G communication systems to IoT networks. For example, technologies such as a sensor network, Machine Type Communication (MTC), and Machine-to-Machine (M2M) communication may be implemented by beamforming, MIMO, and array antennas. Application of a cloud Radio Access Network (RAN) as the above-described Big Data processing technology may also be considered to be as an example of convergence between the 5G technology and the IoT technology.

In the 5th generation mobile communication system standards, the use of error correction codes according to various kinds of data transmission is being discussed. For example, in case of transmitting information of a very short length in the data transmission unit of several bits, the use of a block code in which the minimum Hamming distance between all codes is optimized is required.

SUMMARY

The present disclosure provides a block code having the optimal performance when information of a short length such as several bits is transmitted, and also provides a method and apparatus for encoding and decoding that use the block code.

According to embodiments, a method for encoding information bits may comprise receiving the information bits; encoding the information bits by using a block code; and outputting a codeword generated as a result of the encoding, wherein a length of the information bits is a maximum of 13 bits, and wherein the block code is composed of a Walsh basis sequence and a mask basis sequence.

According to embodiments, a method for decoding an input signal may comprise receiving the input signal; calculating a correlation between the received input signal and all Reed-Muller codes; and outputting information bits corresponding to a highest correlation value, based on the calculated correlation, wherein a length of the information bits is a maximum of 13 bits.

According to embodiments, an encoder encoding information bits may comprise a plurality of multipliers multiplying each of the information bits by a value of each row of an inputted block code and applying a resultant value to an adder; and an adder exclusively adding the values applied by the plurality of multipliers and outputting the added values, wherein a length of the information bits is a maximum of 13 bits, and wherein the block code is composed of a Walsh basis sequence and a mask basis sequence.

According to embodiments, a decoder decoding an input signal may comprise a correlation calculator calculating a correlation between the input signal and all Reed-Muller codes; and a correlation comparator outputting information bits corresponding to a highest correlation value, based on the calculated correlation, wherein a length of the information bits is a maximum of 13 bits.

The encoding/decoding method and apparatus according to embodiments of the present disclosure may allow reliable transmission of information having several bits and reduce complexity in decoding.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document. Those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 2 is a diagram illustrating a generator matrix of an encoder block 102;

FIG. 4 is a diagram illustrating a generator matrix of an encoder block 300;

FIG. 10A is a diagram illustrating a generator matrix of an encoder operating with a (32, 11) code when input information bits are from 4 bits to 11 bits;

FIG. 10B is a diagram illustrating a generator matrix of an encoder operating with a (20, 13) code when input information bits are from 4 bits to 13 bits;

FIG. 10C is a diagram illustrating the entire generator matrix for generating a (7, 3) simplex code and a dotted line portion thereof used when 3-bit input information bits are inputted;

FIG. 10D is a diagram illustrating the entire generator matrix for generating a (3, 2) simplex code and a dotted line portion thereof used when 2-bit input information bits are inputted;

FIG. 10E is a diagram illustrating the entire generator matrix for generating a (1, 1) repetition code and a dotted line portion thereof used when 1-bit input information bit is inputted;

DETAILED DESCRIPTION

Figure 1:
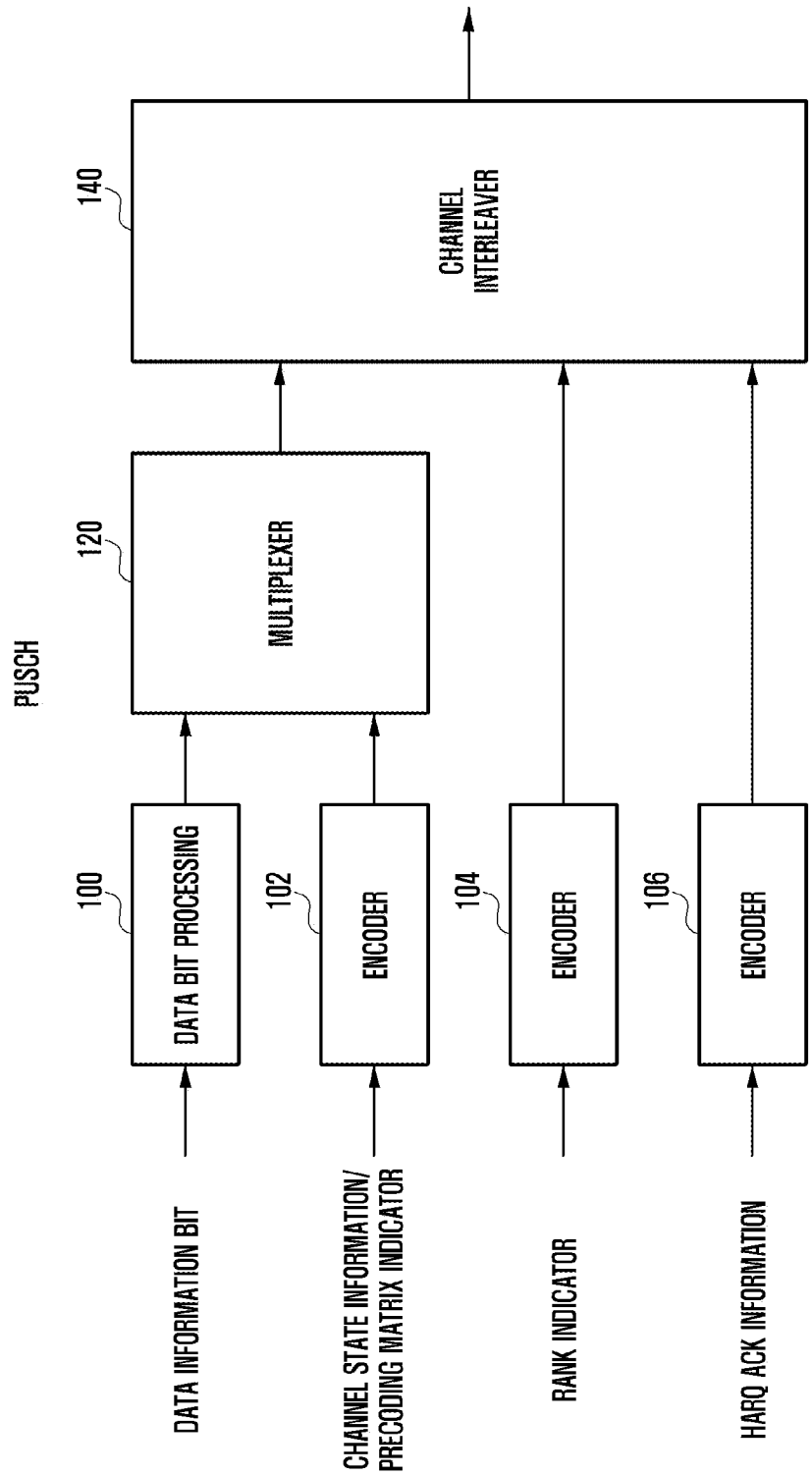
FIG. 1 is a diagram illustrating a signal processing method of an uplink shared channel (PUSCH) of the 4th generation LTE system.

FIGS. 1 through 12, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, embodiments of the present disclosure will be described with reference to the accompanying drawings. In the following description of embodiments, descriptions of techniques that are well known in the art and not directly related to the present disclosure are omitted. This is to clearly convey the subject matter of the present disclosure by omitting an unnecessary explanation.

For the same reason, some elements in the drawings are exaggerated, omitted, or schematically illustrated. Also, the size of each element does not entirely reflect the actual size. In the drawings, the same or corresponding elements are denoted by the same reference numerals.

In addition, terms used herein are defined in consideration of functions of this disclosure and may be varied depending on a user or an operator's intention or custom. Therefore, the definition should be made based on the contents throughout this description.

The advantages and features of the present disclosure and the manner of achieving them will become apparent with reference to embodiments described in detail below with reference to the accompanying drawings. The present disclosure may, however, be embodied in many different forms and should not be construed as limited to embodiments set forth herein. Rather, these embodiments are provided so that this disclosure will be thorough and complete, and will fully convey the scope of the disclosure to those skilled in the art. To fully disclose the scope of the disclosure to those skilled in the art, and the disclosure is only defined by the scope of claims.

It will be understood that each block of the flowchart illustrations, and combinations of blocks in the flowchart illustrations, may be implemented by computer program instructions. These computer program instructions may be provided to a processor of a general purpose computer, special purpose computer, or other programmable data processing apparatus to produce a machine, such that the instructions, which are executed via the processor of the computer or other programmable data processing apparatus, generate means for implementing the functions specified in the flowchart block or blocks. These computer program instructions may also be stored in a computer usable or computer-readable memory that may direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that are executed on the computer or other programmable apparatus provide steps for implementing the functions specified in the flowchart block or blocks.

In addition, each block of the flowchart illustrations may represent a module, segment, or portion of code, which comprises one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

The term "unit", as used herein, may refer to a software or hardware component or device, such as a field programmable gate array (FPGA) or application specific integrated circuit (ASIC), which performs certain tasks. A unit may be configured to reside on an addressable storage medium and configured to execute on one or more processors. Thus, a module or unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units may be combined into fewer components and units or further separated into additional components and modules. In addition, the components and units may be implemented to operate one or more central processing units (CPUs) in a device or a secure multimedia card.

The present disclosure relates to error correction codes (interchangeably used with error correcting codes or channel coding) for correcting or restoring an information bit when an error or loss occurs in the information bit because of various causes such as noise or interference during information bit transmission in a communication system. Specifically, the present disclosure relates to encoding and decoding methods and apparatuses that use a block code for transmission of information bits, such as control information, having a short length in a communication system.

In a mobile communication system, various types of data are transmitted in various environments. In order to minimize information loss due to errors of data bits occurring in various forms in such data transmission, various error correction code techniques suitable for respective environments are used. Also, in the 5th generation mobile communication system standard, error correction codes according to various kinds of data transmission are being discussed. For example, the use of a low density parity check (LDPC) code is being considered in a data channel that requires a high-capacity and high-speed transmission in the transmission unit of a large length or size. On the other hand, the use of a polar code is being considered in a control channel that requires the data transmission unit of a relatively shorter length.

However, in case where the data transmission unit has a very short length of several bits, the use of a block code capable of theoretically maximizing the minimum Hamming distance (hereinafter referred to as "minimum distance") between all codewords in comparison with the performance of the above-mentioned error correction codes is being considered. In case of the existing 4th generation Long Term Evolution (LTE) system, a (32, 11) block code is used when information having a very short length of 11 bits or less, such as channel state information or a precoding matrix indicator, is transmitted on a physical uplink shared channel (PUSCH), and a (20, 13) block code is used when control information of 13 bits or less, such as channel state information or an HARQ ACK signal, is transmitted on a physical uplink control channel (PUCCH). Control information signals of the control channel are signals that a receiver should know in advance in order to process a received signal when receiving data on the data channel, thus ensuring the optimal transmission reliability. For this, channel coding with the optimum error correcting performance used for information of a very short length is used. In particular, the use of a block code for optimizing the minimum Hamming distance between all codes, which is a measure for theoretically judging the error correcting performance, is used.

FIG. 1 is a diagram illustrating a signal processing method of an uplink shared channel (PUSCH) of the 4th generation LTE system. Referring to FIG. 1, a data information bit to be transmitted by a user in uplink is inputted into a data bit processing block 100, which generates a data information transmission signal by performing a CRC bit addition for data transmission, a code block segmentation, a data information encoding, and a rate matching. In addition, control information such as channel state information, used for improving the reception performance of a receiver, and an information indicator for a precoding matrix is inputted into an encoder block 102 and then encoded. This encoder receives the control information up to 11 bits, encodes the received information to output 32 code symbols, and applies the symbols to a multiplexer block 120. Then, the multiplexer block 120 multiplexes the data transmission signal outputted from the data bit processing block 100 and the control information signal outputted from the encoder block 102, and applies the multiplexed signal to a channel interleaver block 140. In addition, rank information of a transmission channel associated with multiple antennas is inputted into an encoder block 104, encoded, and applied to the channel interleaver block 140. Simultaneously, HARQ-ACK information for a downlink channel corresponding to the above channel is inputted into an encoder block 106, encoded, and inputted into the channel interleaver block 140. Then, the channel interleaver block 140 performs interleaving to obtain a transmission channel diversity effect on the input signals, and outputs the interleaved signals.

FIG. 2 is a diagram illustrating a generator matrix of the encoder block 102. The encoder block 102 can encode the channel state information and the precoding matrix indicator. As mentioned above, the control signal may be transmitted to the receiver up to 11 bits. When an 11-bit control information signal is inputted into the encoder block 102, the first control information bit is multiplied in a bit unit by $M_{i,0}$ having a length of 32 in the first column of the matrix shown in FIG. 2. Similarly, the second bit is multiplied by $M_{i,1}$, and the third bit is multiplied by $M_{i,2}$. In this way, the last 11th bit is multiplied by $M_{i,10}$ in a bit unit. As a result of this calculation, eleven signal sequences each having a length of 32 are outputted.

Figure 3:
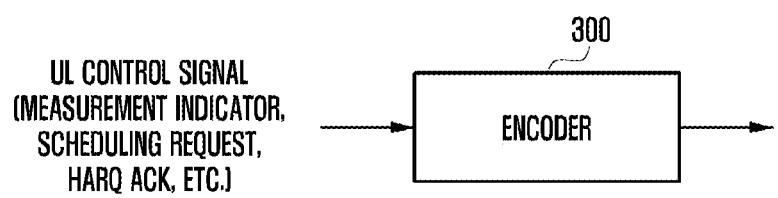
FIG. 3 is a diagram illustrating a signal processing method of an uplink control channel (PUCCH) of the 4th generation LTE system.

FIG. 3 is a diagram illustrating a signal processing method of an uplink control channel (PUCCH) of the 4th generation LTE system. Referring to FIG. 3, when an uplink control signal such as a measurement indicator indicating a downlink channel measurement result, uplink scheduling request information, and HARQ-ACK information is inputted into an encoder block 300, the encoder block 300 encodes the control signal and outputs the encoded signal. At this time, the uplink control signal can be inputted up to 13 bits, and the length of a codeword outputted from the encoder block 300 is composed of 20 symbols or bits.

FIG. 4 is a diagram illustrating a generator matrix of the encoder block 300. When a 13-bit control signal is inputted into the encoder block 300, the first control information bit is multiplied in a bit unit by $M_{i,0}$ having a length of 20 in the first column of the matrix shown in FIG. 4. Similarly, the second bit is multiplied by $M_{i,1}$, and the third bit is multiplied by $M_{i,2}$. In this way, the last 13th bit is multiplied by $M_{i,12}$ in a bit unit. As a result of this calculation, thirteen signal sequences each having a length of 20 are outputted.

As described above, when a block code is used for error correction codes for a short-length input signal, it is important to use the block code having a greater value of the minimum Hamming distance which is a measure of error correction performance. The bounds of the minimum Hamming distance according to the number of input/output bits of binary linear codes to be optimal codes are as described in the following document and incorporated herein by reference.

An Updated Table of Minimum-Distance Bounds for Binary Linear Codes (A. E. Brouwer and Tom Verhoeff, IEEE Transactions on information Theory, VOL 39, NO. 2, MARCH 1993)

Table 1 below shows the comparison of bounds described in the above reference document and the minimum Hamming distances according to input bit numbers of a (32, 11) block code used in the LTE system shown in FIG. 2.

TABLE 1

| | Input bit number | | | | | | | | | | |
|---|---|---|---|---|---|---|---|---|---|---|---|
| | 1 | 2 | 3 | 4 | 5 | 6 | 7 | 8 | 9 | 10 | 11 |
| Bound | 32 | 21 | 18 | 16 | 16 | 16 | 14 | 13 | 12 | 12 | 12 |
| (32, 11) block code in LTE system | 32 | 16 | 16 | 16 | 16 | 16 | 12 | 12 | 12 | 12 | 10 |

Referring to the minimum Hamming distance shown in Table 1, the (32, 11) code which is a block code used in the LTE system is an optimal code satisfying the bounds when the input bit number is 4, 5, 6, 9, or 10. However, when the input bit number is 2, 3, or 11, the (32, 11) code is not an optimal code because of failing to satisfy the bounds. Therefore, when 2, 3, or 11 input bits are inputted, the transmission efficiency is lowered.

Accordingly, the present disclosure provides an efficient block encoding apparatus and method that realize excellent performance in a communication system. In addition, the present disclosure provides an efficient block decoding apparatus and method in a communication system. In addition, the present disclosure provides an encoding apparatus and method capable of generating an optimal code in a communication system. In addition, the present disclosure provides an encoding apparatus and method using an enhanced Reed-Muller code so as to generate an optimal code in a communication system.

Normally, the distribution of Hamming distances between codewords is considered as a measure indicating the performance of linear error correction codes. This is the same as the distribution of the number of symbols 1 in each codeword. The Hamming distance having the smallest value in the distribution of Hamming distances is referred to as the minimum Hamming distance. In general, the linear error correction codes have excellent error correcting performance as the minimum Hamming distance is greater.

In order to optimize the minimum Hamming distance, the improved Reed-Muller code described herein may be designed using the characteristics of a sequence having an excellent correlation property. The correlation property of a sequence may vary depending on the length of the sequence, and the number of sequences satisfying such a property may also vary depending on the length of the sequence. The present disclosure provides an encoding method for generating a code having a length $L=32=2^5$, wherein a gold sequence is used as a sequence applicable to this length. When the improved Reed-Muller code is designed using the gold sequence, the improved Reed-Muller code has a minimum Hamming distance of 12 with the (32, 11) code, and can achieve the bounds of the minimum Hamming distance with the (32, 11) code when the input bit number is 11 bits.

Hereinafter, an apparatus and method for generating an improved Reed-Muller code having excellent performance by using a group of gold sequences having excellent correlation properties will be described.

Figure 5:
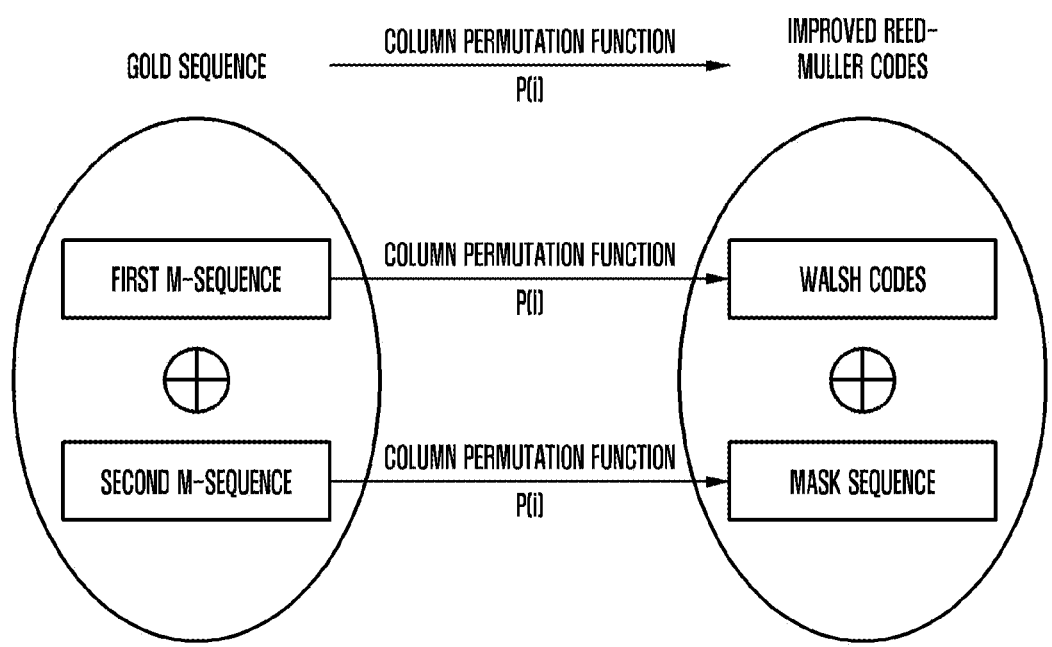
FIG. 5 is a diagram conceptually illustrating a method for generating an improved Reed-Muller code.

FIG. 5 is a diagram conceptually illustrating a method for generating an improved Reed-Muller code. Generally, a gold sequence is generated by summing two m-sequences (hereinafter, referred to as a first m-sequence and a second m-sequence) having a good cross correlation property. Additionally, in case of an m-sequence having an excellent auto-correlation property, there exists a column permutation function P(i) which can transform the m-sequence into a residual sequence obtained by subtracting the 0 value from the first column of the Walsh code. Therefore, when the gold sequence shown in FIG. 5 is transformed using such a column permutation function, the first m-sequence is transformed into the Walsh code, and the second m-sequence is transformed into a specific sequence referred to as a mask sequence.

In case of the gold sequence, a sequence group formed of the sum of two m-sequences obtained through independent circular shifts of the first and second m-sequences may be generated, and a correlation property between different sequences in such a sequence group is very good. In case of transforming a gold sequence group by means of the column permutation function P(i), the sequences obtained through circular shifts of the first m-sequence are all transformed into different Walsh codes, and the sequences obtained through circular shifts of the second m-sequence are all transformed into different mask sequences. Generally, when the same column permutation function is applied to all sequences in a sequence group, the correlation property between different sequences is maintained. Therefore, the different mask sequences maintain the correlation property with the Walsh codes.

According to characteristics of the gold sequence having a length of N−1, the correlation value (Corr) between two different sequences in the sequence group has a property as shown in Equation 1.

$$-\sqrt{2N}-1 \leq \text{Corr} \leq \sqrt{2N}-1 \qquad \text{Equation 1}$$

In case of a code length N=32, the correlation value (Corr) ranges from −9 to 7, which is equally maintained as correlation between the mask sequence and the Walsh code. After transformed, each of the Walsh codes and the mask sequences is a sequence having a length of 31. Therefore, when the Walsh code and the mask sequence each having a length of 32 are generated by inserting bits 0 into the first column of all the Walsh codes and all the mask sequences in order to make perfect Walsh codes, the correlation value (Corr) of the generated Walsh code and mask sequence ranges from −8 to 8. In this case, the minimum Hamming distance of the sequence group inferred from the above properties of the correlation value is 12.

Now, the number of sequences forming the gold sequence group will be described. An m-sequence having a length of N−1 can undergo circular shifts up to N−1 times. Further, if an all 0-sequence in which all sequence values are 0 is inserted, a group of N sequences are obtained with an excellent correlation.

In this case, the group of N sequences satisfies a linear function structure and has mathematically a linear vector space structure. Thus, there are basis sequences that form the linear vector space. For example, if the number of constituent elements in the vector space is $N=2^n$, there exist n basis sequences. Herein, the term 'basis' refers to the smallest elements that can represent all members of the linear vector space as a linear combination. The elements in a set of such sequences are sequences and thus called the basis sequences. As described above, if the vector space has a size $N=2^n$, there are n basis sequences. Therefore, in case of the above-mentioned group of $32=2^5$ sequences, five basis sequences exist.

As described above, the gold sequence group is represented by the sum of two m-sequences (i.e., the first m-sequence and the second m-sequence). Since there are five basis sequences of each m-sequence, totally ten basis sequences exist in the gold sequence group, and the minimum Hamming distance becomes 12. In addition, even if the vector space further includes an all 1-sequence in which all sequence values are 1, the minimum Hamming distance is maintained. That is, when the all 1-sequence is added as an additional basis sequence, a sequence group having a total of 11 basis sequences is generated with the minimum Hamming distance of 12 maintained.

If this sequence group is transformed to the improved Reed-Muller codes through the column permutation function as shown in FIG. 5, codes that satisfy the minimum Hamming distance bounds of the (32, 11) code as shown in Table 1 can be generated.

Figure 6:
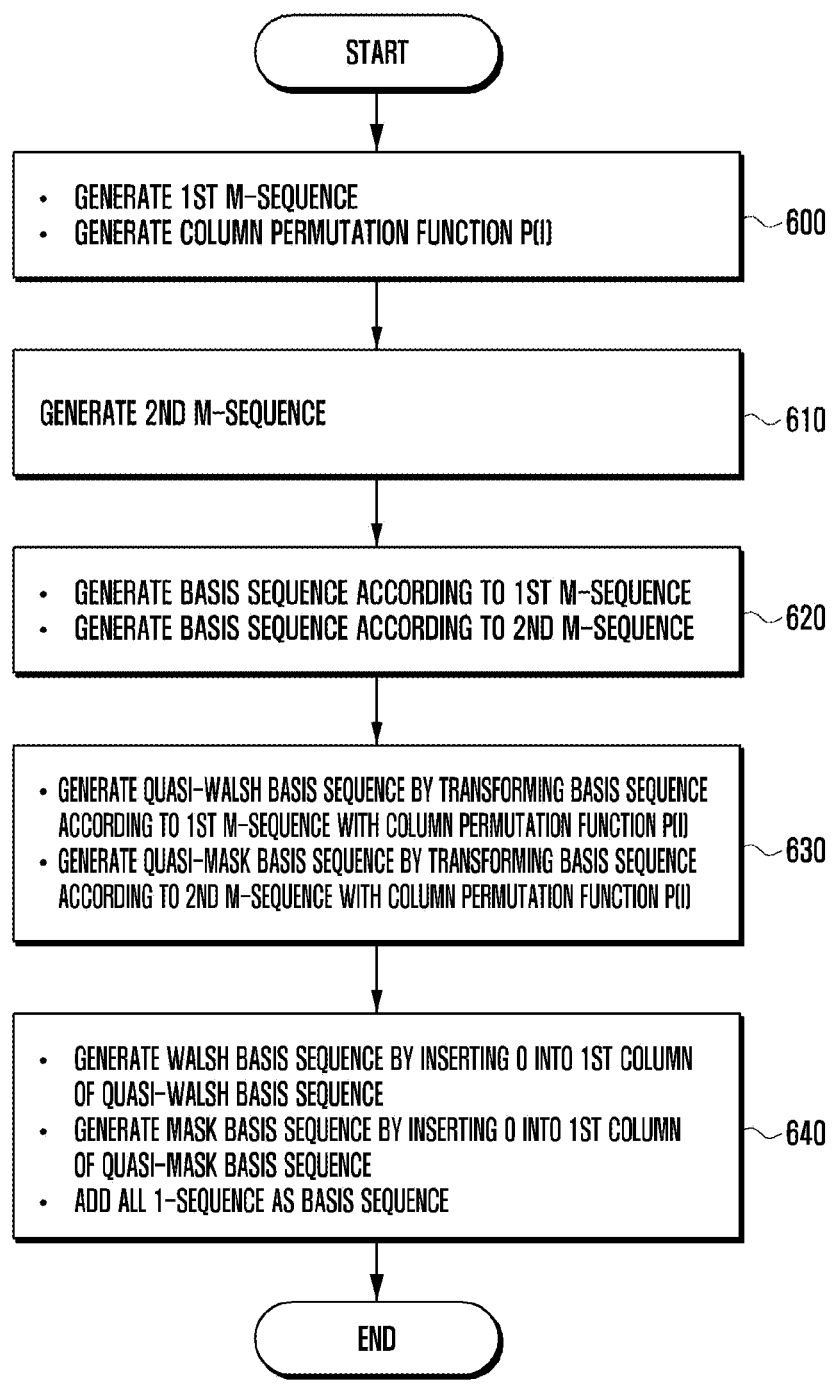
FIG. 6 is a flow diagram illustrating a code generation method according to the present disclosure.
Figure 7A:
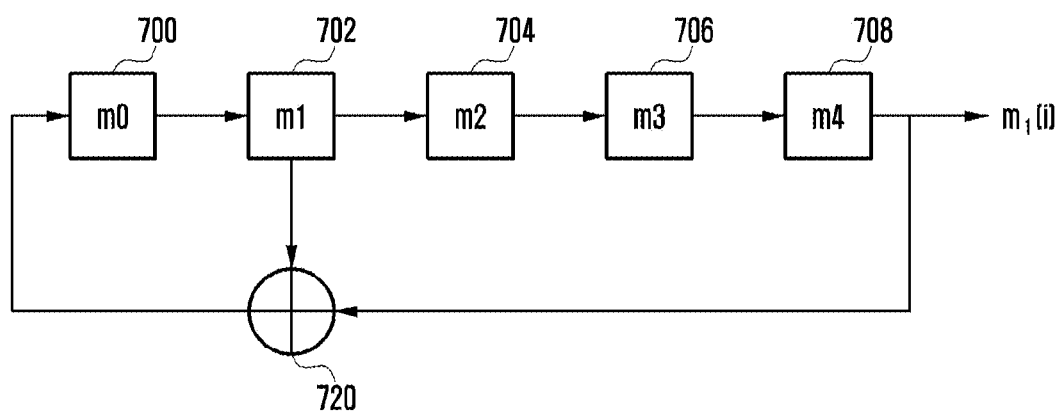
FIG. 7A is a diagram illustrating a shift register using a generating polynomial $f_1(x)=x^5+x^2+1$ for generating a first m-sequence having a length of 31.

FIG. 6 is a flow diagram illustrating a code generation method according to the present disclosure. Referring to FIG. 6, at step 600, a first m-sequence is generated, and a column permutation function P(i) for transforming the first m-sequence to the Walsh code is generated. In general, the first m-sequence is defined by a generator polynomial. FIG. 7A is a diagram illustrating a shift register using a polynomial $f_1(x)=x^5+x^2+1$ for generating a first m-sequence having a length of 31.

The operation of a first m-sequence generator will be described with reference to FIG. 7A. A register 700 is initialized with a binary signal 1, and other registers 702, 704, 706, and 708 are initialized with a binary signal 0. Thereafter, a binary signal value stored in the register 708 is outputted as a sequence value of the m-sequence, and also this value is inputted into a binary adder 720. At this time, a stored value of the register 706 is inputted into and stored in the register 708, a stored value of the register 704 is inputted into and stored in the register 706, a stored value of the register 702 is inputted into and stored in the register 704, and a stored value of the register 700 is inputted into and stored in the register 702. At the same time, the stored value of the register 702 is also inputted into the binary adder 720 and is binary-added with the output value of the register 708. The resultant value is outputted to and stored in the register 700.

After the above one-time register shift, in the same manner, the binary signal stored in the register 708 is outputted as the second output value of the m-sequence, and also this value is inputted into the binary adder 720. At this time, the stored value of the register 706 is inputted into and stored in the register 708, the stored value of the register 704 is inputted into and stored in the register 706, the stored value of the register 702 is inputted into and stored in the register 704, and the stored value of the register 700 is inputted into and stored in the register 702. At the same time, the stored value of the register 702 is also inputted into the binary adder 720 and is binary-added with the output value of the register 708. The resultant value is outputted to and stored in the register 700.

If the above operation is repeated, the output value of the first m-sequence is generated from the register 708 at each register shift. For example, as the m-sequence generated based on the fifth-order generator polynomial $f_1(x)=x^5+x^2+1$ using five registers, a sequence of length $2^5-1=31$ is repeatedly outputted. Thus, at step 600 of FIG. 6, thirty-one output values as described in FIG. 7A are generated as the first m-sequence. The values, m4, m3, m2, m1, and m0, stored in the respective registers 708, 706, 704, 702, and 700 are changed at each register shift in the first m-sequence generator as shown in FIG. 7A. If the above generator polynomial is a generator polynomial for generating the m-sequence having the maximum cycle, the five stored values of the registers represent thirty-one different values except for all 0s.

In this case, the column permutation function P(i) for transforming the first m-sequence of step 600 in FIG. 6 into the Walsh code is generated based on such register values. Now, a generation method of the column permutation function P(i) is described with reference to FIG. 7A. If the values stored in the registers 700, 702, 704, 706, and 708 at the i-th register shift in the operation of the shift register are m0, m1, m2, m3, and m4, these values are expressed as a binary value (m0 m1 m2 m3 m4)$_2$ and then converted into a decimal notation to obtain a column permutation function having a value P(i) as a function value of i. That is, when i is 1, the values m0, m1, m2, m3, and m4 stored in the registers 700, 702, 704, 706, and 708 are initialized to 1, 0, 0, 0, and 0, which are expressed as a binary value (10000)$_2$ and then converted to 16 in a decimal notation. Therefore, P(1) becomes 16.

Thereafter, when the next register shift (i.e., i=2) is performed, the values m0, m1, m2, m3, and m4 stored in the registers 700, 702, 704, 706, and 708 are changed to 0, 1, 0, 0, and 0, which are expressed as a binary value $(01000)_2$ and then converted to 8 in a decimal notation. Therefore, P(2) becomes 8. Similarly, when the next register shift (i.e., i=3) is performed, the values m0, m1, m2, m3, and m4 stored in the registers 700, 702, 704, 706, and 708 are changed to 1, 0, 1, 0, and 0, which are expressed as a binary value $(10100)_2$ and then converted to 20 in a decimal notation. Therefore, P(2) becomes 20.

When thirty-one register shifts are performed in the above manner, the first m-sequence is outputted as 0000101011101100011111001101001 having a 31-bit length as a result of step 600 in FIG. 6. Also, the column permutation function according to the first m-sequence is outputted as shown in Table 2.

TABLE 2

| i | P(i) |
|---|---|
| 1 | 16 |
| 2 | 8 |
| 3 | 20 |
| 4 | 10 |
| 5 | 21 |
| 6 | 26 |
| 7 | 29 |
| 8 | 14 |
| 9 | 23 |
| 10 | 27 |
| 11 | 13 |
| 12 | 6 |
| 13 | 3 |
| 14 | 17 |
| 15 | 24 |
| 16 | 28 |
| 17 | 30 |
| 18 | 31 |
| 19 | 15 |
| 20 | 7 |
| 21 | 19 |
| 22 | 25 |
| 23 | 12 |
| 24 | 22 |
| 25 | 11 |
| 26 | 5 |
| 27 | 18 |
| 28 | 9 |
| 29 | 4 |
| 30 | 2 |
| 31 | 1 |

Figure 7B:
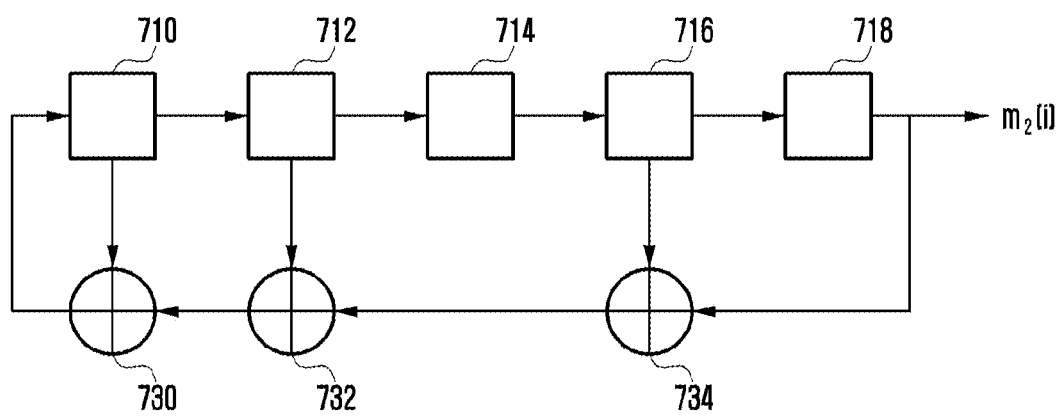
FIG. 7B is a diagram illustrating a shift register using a generating polynomial $f_1(x)=x^5+x^4+x^2+x+1$ for generating a second m-sequence having a length of 31.

Thereafter, at step 610, the second m-sequence for constructing the gold sequence is generated. The second m-sequence is defined by a generator polynomial in the same manner as the first m-sequence, and the generator polynomial is selected to have an excellent correlation property between two m-sequences. FIG. 7B is a diagram illustrating a shift register using a polynomial $f_2(x)=x^5+x^4+x^2+1$ for generating the second m-sequence having a length of 31.

Referring to FIG. 7B, a register 710 is initialized with the value of binary signal 1, and other registers 712, 714, 716, and 718 are initialized with the value of binary signal 0. Thereafter, a binary signal value stored in the register 718 is outputted as a sequence value of the m-sequence, and also this value is inputted into a binary adder 734. At this time, a stored value of the register 716 is inputted into the register 718 and also outputted to the binary adder 734, a stored value of the register 714 is inputted into the register 716, a stored value of the register 712 is inputted into the register 714 and also outputted to a binary adder 732, and a stored value of the register 710 is inputted into the register 712 and also outputted to a binary adder 730. The binary adder 734 adds the binary signals inputted from the registers 716 and 718 and then outputs the binary-added signal to the binary adder 732. The binary adder 732 adds the binary signals inputted from the register 712 and the binary adder 734 and then outputs the binary-added signal to the binary adder 730. The binary adder 730 adds the binary signals inputted from the register 710 and the binary adder 732 and then output the binary-added signal to the register 710.

After the above one-time register shift, in the same manner, the binary signal value stored in the register 718 is outputted as the sequence value of the m-sequence, and also this value is inputted into the binary adder 734. At this time, the stored value of the register 716 is inputted into the register 718 and also outputted to the binary adder 734, the stored value of the register 714 is inputted into the register 716, the stored value of the register 712 is inputted into the register 714 and also outputted to the binary adder 732, and the stored value of the register 710 is inputted into the register 712 and also outputted to the binary adder 730. Then, the binary adder 734 adds the binary signals inputted from the registers 716 and 718 and then outputs the binary-added signal to the binary adder 732. Also, the binary adder 732 adds the binary signals inputted from the register 712 and the binary adder 734 and then outputs the binary-added signal to the binary adder 730. And also, the binary adder 730 adds the binary signals inputted from the register 710 and the binary adder 732 and then output the binary-added signal to the register 710.

If the above operation is repeated, the output value of the second m-sequence is generated from the register 718 at each register shift. For example, as the m-sequence generated on the basis of the fifth-order generator polynomial $f_2(x)=x^5+x^4+x^2+1$ using five registers, a sequence of length $2^5-1=31$ is repeatedly outputted. Thus, at step 610 in FIG. 6, thirty-one output values as described in FIG. 7B are generated as the second m-sequence. That is, at step 610 in FIG. 6, the second m-sequence is outputted as 0000110101001000101111101100111 having a 31-bit length.

Thereafter, at step 620, basis sequences are generated from the first m-sequence generated at step 600, and also basis sequences are generated from the second m-sequence generated at step 610.

As described above, an m-sequence having a length of $N-1=2^n-1$ forms a group of m-sequences having an excellent cross correlation through a circular shift up to N-1 times. At this time, there are n bases of such a group, and each basis is expressed in a circular shift form. In case of the m-sequence of length 31, there are five basis sequences. At step 620, the basis sequences may be obtained through circular shifts of the m-sequences generated at steps 600 and 610. In particular, in case of the m-sequence having a length of 31, if an initial m-sequence is generated from the register initial values 0, 0, 0, 0, and 1, the basis sequences may be formed of the above m-sequence, a sequence obtained through a one-time circular shift of the above m-sequence, a sequence obtained through two-time circular shifts, a sequence obtained through three-time circular shifts, and a sequence obtained through four-time circular shifts. In this manner, the basis sequences according to the first and second m-sequences are outputted as follows.

<Basis Sequence According to First m-Sequence>
0000101011101100011111001101001,
0001010111011000111110011010010,
0010101110110001111100110100100, 0101011101100011111001101001000,
1010111011000111110011010010000
<Basis Sequence According to Second m-Sequence>
0000110101001000101111101100111,
0001101010010001011111011001110,
0011010100100010111110110011100,
0110101001000101111011001111000,
1101010010001011111011001110000

After the basis sequences are generated for the first and second m-sequences at step 620, the basis sequences undergo a column permuting process at step 630 by using the column permutation function P(i) generated at step 600. For example, in the column permutation function as shown in Table 2 for a sequence having a length of 31, P(1)=16 means shifting the first binary value of the sequence to the 16th column of the sequence, P(2)=8 means shifting the second binary value to the 8th column, and P(22)=25 means shifting the 22nd binary value to the 25th column.

When the column permuting process is performed for the basis sequences as described above, a quasi-Walsh basis sequence and a quasi-mask basis sequence are generated as follows.

<Quasi-Walsh Basis Sequence>
1010101010101010101010101010101
0110011001100110011001100110011
0001111000011110000111100001111
0000000111111110000000011111111
0000000000000001111111111111111
<Quasi-Mask Basis Sequence>
1111101000110110001010001110010
0101011011100010001011101001101
0001001011011100111010101000111
0000101100100101101100010111111
0010100101100011011000111101011

Thereafter, at step 640, a Walsh basis sequence and a mask basis sequence each of which has a length of 32 are generated by inserting 0 into the first column of each of the quasi-Walsh and quasi-mask basis sequences. Also, an all 1-sequence in which all columns have the value of 1 is added as a basis sequence. Therefore, a total of eleven basis sequences $M_{i,k}$ are generated as follows. Here, subscript 'i' denotes the i-th binary sequence value of each basis sequence, and 'k' denotes a basis sequence number. In this k, 0 to 4 indicate the Walsh basis sequences, and 6 to 10 indicate the mask basis sequences.

$M_{i,0}$=01010101010101010101010101010101
$M_{i,1}$=00110011001100110011001100110011
$M_{i,2}$=00001111000011110000111100001111
$M_{i,3}$=00000000111111110000000011111111
$M_{i,4}$=00000000000000001111111111111111
$M_{i,5}$=11111111111111111111111111111111
$M_{i,6}$=01111101000110110001010001110010
$M_{i,7}$=00101011011100010001011101001101
$M_{i,8}$=00001001011011100111010101000111
$M_{i,9}$=00000101100100101101100010111111
$M_{i,10}$=00010100101100011011000111101011

Now, various embodiments about an encoder and a decoder, which operate based on the improved Reed-Muller code generated above, will be described.

In one embodiment, an encoding apparatus and method according to basis sequences generated as described above will be described.

Figure 8:
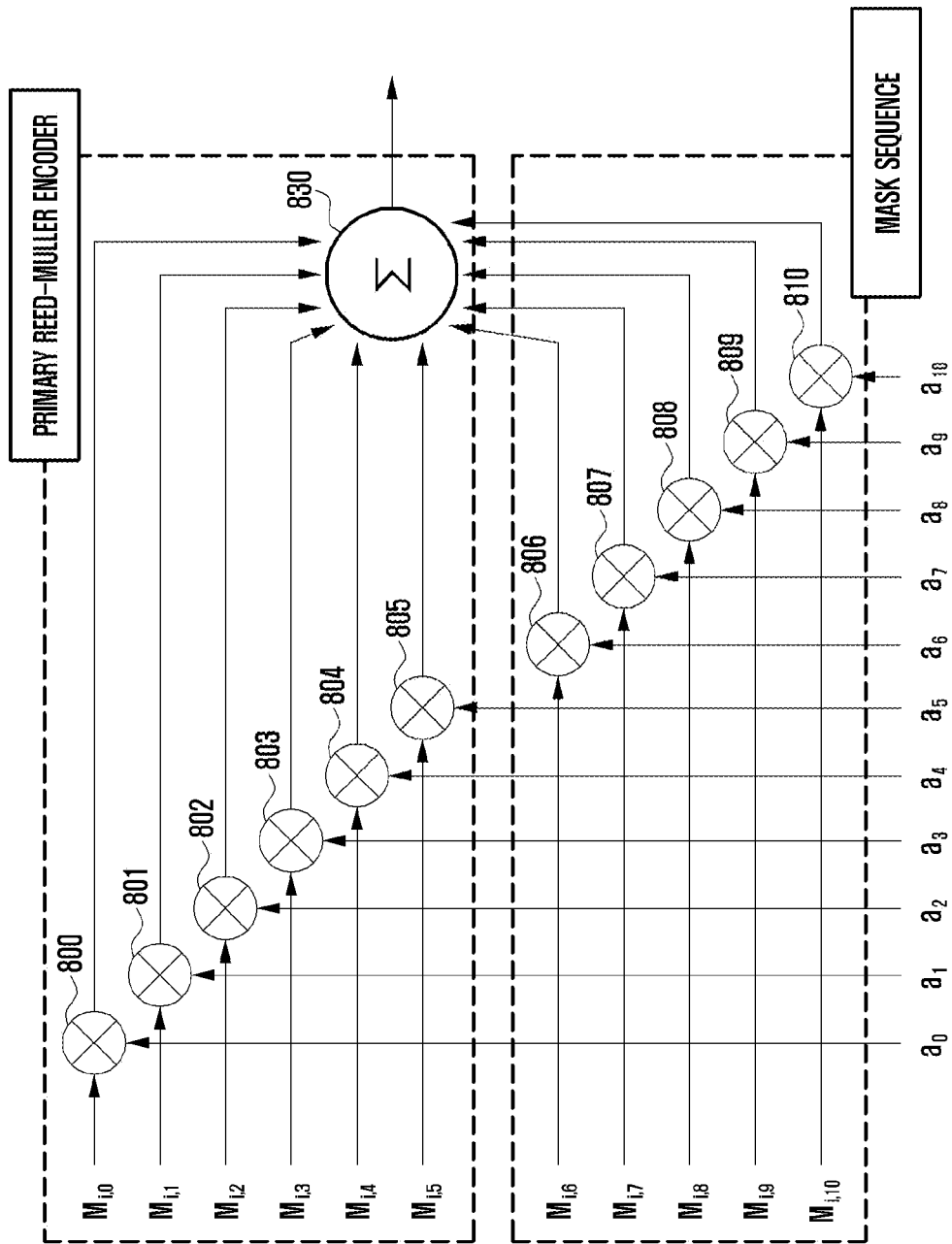
FIG. 8 is a diagram illustrating an operation of an encoding apparatus based on an improved Reed-Muller code according to the present disclosure.

FIG. 8 is a diagram illustrating an operation of an encoding apparatus based on an improved Reed-Muller code according to the present disclosure. In the following description, the basis sequence refers to sequences defined as follows.

$M_{i,0}$=01010101010101010101010101010101
$M_{i,1}$=00110011001100110011001100110011
$M_{i,2}$=00001111000011110000111100001111
$M_{i,3}$=00000000111111110000000011111111
$M_{i,4}$=00000000000000001111111111111111
$M_{i,5}$=11111111111111111111111111111111
$M_{i,6}$=01111101000110110001010001110010
$M_{i,7}$=00101011011100010001011101001101
$M_{i,8}$=00001001011011100111010101000111
$M_{i,9}$=00000101100100101101100010111111
$M_{i,10}$=00010100101100011011000111101011

When eleven information bits, $a_0$, $a_1$, $a_2$, $a_3$, $a_4$, $a_5$, $a_6$, $a_7$, $a_8$, $a_9$, and $a_{10}$, are inputted into the encoder, the first information bit $a_0$ is inputted into a multiplier 800. Similarly, the second information bit $a_1$ is inputted into a multiplier 801, the third information bit $a_2$ into a multiplier 802, the fourth information bit $a_3$ into a multiplier 803, the fifth information bit $a_4$ into a multiplier 804, the sixth information bit $a_5$ into a multiplier 805, the seventh information bit $a_6$ into a multiplier 806, the eighth information bit $a_7$ into a multiplier 807, the ninth information bit $a_8$ into a multiplier 808, the tenth information bit $a_9$ into a multiplier 809, and the eleventh information bit $a_{10}$ into a multiplier 810.

Thereafter, the first bit 0 of the basis sequence $M_{i,0}$ is inputted into the multiplier 800, multiplied by the information bit $a_0$, and then applied to an adder 830. Similarly, the first bit 0 of the basis sequence $M_{i,1}$ is inputted into the multiplier 801, multiplied by the information bit $a_1$, and then applied to the adder 830. Also, the first bit 0 of the basis sequence $M_{i,2}$ is inputted into the multiplier 802, multiplied by the information bit $a_2$, and then applied to the adder 830. Also, the first bit 0 of the basis sequence $M_{i,3}$ is inputted into the multiplier 803, multiplied by the information bit $a_3$, and then applied to the adder 830. Also, the first bit 0 of the basis sequence $M_{i,4}$ is inputted into the multiplier 804, multiplied by the information bit $a_4$, and then applied to the adder 830. Also, the first bit 0 of the basis sequence $M_{i,5}$ is inputted into the multiplier 805, multiplied by the information bit $a_5$, and then applied to the adder 830. Also, the first bit 0 of the basis sequence $M_{i,6}$ is inputted into the multiplier 806, multiplied by the information bit $a_6$, and then applied to the adder 830. Also, the first bit 0 of the basis sequence $M_{i,7}$ is inputted into the multiplier 807, multiplied by the information bit $a_7$, and then applied to the adder 830. Also, the first bit 0 of the basis sequence $M_{i,8}$ is inputted into the multiplier 808, multiplied by the information bit $a_8$, and then applied to the adder 830. Also, the first bit 0 of the basis sequence $M_{i,9}$ is inputted into the multiplier 809, multiplied by the information bit $a_9$, and then applied to the adder 830. And also, the first bit 0 of the basis sequence $M_{i,10}$ is inputted into the multiplier 810, multiplied by the information bit $a_{10}$, and then applied to the adder 830. The adder 830 exclusively adds the signals inputted from the multipliers 800, 801, 802, 803, 804, 805, 806, 807, 808, 809, and 810 and thereby outputs a first code symbol. Thereafter, the second bits of the basis sequences $M_{i,k}$ are calculated respectively in the same manner as described above, and a second code symbol is outputted from the adder 830. This operation is repeated thirty-two times corresponding to the length of the basis code, and thereby code symbols having a length of 32 are outputted.

In the above-described encoding method according to an embodiment, upper six basis sequences are composed of the Walsh basis sequences and the all 1-sequence, so that a portion indicating a linear combination with the first six information bits is the same as the primary Reed-Muller encoder. On the other hand, lower five basis sequences are composed of the mask basis sequences, so that a portion indicating a linear combination with the last five information bits is the mask sequence generator.

The above encoding method according to an embodiment shows a case in which eleven information bits are inputted. If information bits having a length smaller than 11 bits are inputted, only bits corresponding to the number of input information bits are inputted into the multipliers, and the multiplier corresponding to a non-input portion is controlled not to operate. For example, when six information bits are inputted, the first information bit $a_0$ is inputted into the multiplier 800, the second information bit $a_1$ into the multiplier 801, the third information bit $a_2$ into the multiplier 802, the fourth information bit $a_3$ into the multiplier 803, the fifth information bit $a_4$ into the multiplier 804, and the sixth information bit $a_5$ into the multiplier 805. The remaining multipliers 806, 807, 808, 809, and 810 are controlled so as not to operate. Then, the first bit of the basis sequence $M_{i,0}$ is inputted into the multiplier 800, multiplied by the information bit $a_0$, and then applied to the adder 830. Also, the first bit of the basis sequence $M_{i,1}$ is inputted into the multiplier 801, multiplied by the information bit $a_1$, and then applied to the adder 830. Also, the first bit of the basis sequence $M_{i,2}$ is inputted into the multiplier 802, multiplied by the information bit $a_2$, and then applied to the adder 830. Also, the first bit of the basis sequence $M_{i,3}$ is inputted into the multiplier 803, multiplied by the information bit $a_3$, and then applied to the adder 830. Also, the first bit of the basis sequence $M_{i,4}$ is inputted into the multiplier 804, multiplied by the information bit $a_4$, and then applied to the adder 830. And also, the first bit of the basis sequence $M_{i,5}$ is inputted into the multiplier 805, multiplied by the information bit $a_5$, and then applied to the adder 830. The adder 830 exclusively adds the signals inputted from the multipliers 800, 801, 802, 803, 804, and 805 and thereby outputs a first code symbol. In addition, the second bits of the basis sequences $M_{i,k}$ are calculated respectively in the same manner, and a second code symbol is outputted from the adder 830. This operation is repeated thirty-two times corresponding to the length of the basis code, and thereby code symbols having a length of 32 are outputted.

Figure 9:
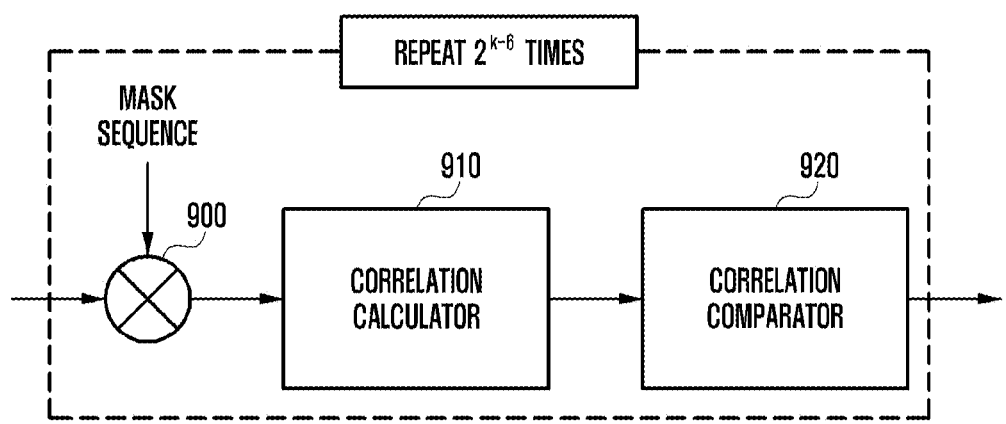
FIG. 9 is a diagram illustrating a decoder operation according to an embodiment of the present disclosure.

FIG. 9 is a diagram illustrating a decoder operation according to an embodiment of the present disclosure.

FIG. 9 shows the operation of a decoder when the number of information bits inputted into an encoder of a transmitter corresponding to the decoder is 11 bits. When the information bit number is 11, the number of mask basis sequences used is 5, and thus the number of all linear combinations is $2^5=32$. That is, a total of 32 kinds of mask sequences are linearly combined with the primary Reed-Muller codes to generate codewords. The primary Reed-Muller code allows the calculation of correlation between all the codewords and the received signal, even with a low calculation amount, through an efficient algorithm such as inverse fast Hadamard transform (IFHT). In case where the improved Reed-Muller codes are used for encoding, a decoding operation is performed through a combination of the mask sequence and the primary Reed-Muller codeword in order to use an efficient algorithm such as IFHT. That is, when a received signal is inputted into the decoder, all combinable mask sequences are multiplied, and then correlation values with codewords in all cases are efficiently calculated by performing a correlation calculator such as IFHT. In this manner, the optimal decoding performance can be achieved. Specifically, the computational complexity for calculating the correlation value can be reduced to 5/64 when the code length is 32.

Now, the decoder operation using the improved Reed-Muller code will be described with reference to FIG. 9.

When a received signal having a length of 32 is inputted into the decoder, the received signal is inputted into a multiplier 900. Then, the multiplier 900 multiplies the received signal by one of possible mask sequences in a symbol unit and outputs a resultant signal. At this time, the number of possible mask sequences is $2^5=32$ since the mask sequence is a combination of five mask basis sequences, and one of 32 possible mask sequences is selected and inputted into the multiplier 900.

When a signal sequence of 32 symbols outputted from the multiplier 900 is inputted into a correlation calculator 910, the correlation calculator 910 calculates correlation values between the inputted 32-symbol signal sequence and all primary Reed-Muller codes, and applies the calculated correlation values to a correlation comparator 920. Then, the correlation comparator 920 stores the greatest one of the inputted correlation values and corresponding 11-bit information bits. Thereafter, the received signal is inputted again into the multiplier 900, and a mask sequence other than the previously selected mask sequence among possible mask sequences is inputted into the multiplier 900. Then, the above operation is repeated. The correlation calculator 910 calculates the correlation values and applies them to the correlation comparator 920. The correlation comparator 920 calculates the greatest one of the correlation values including the previously stored correlation value, and stores it together with corresponding 11-bit information bits. The above operation is repeated for all the 32 mask sequences. After this repetition, the correlation comparator 920 outputs, as decoded information bits, the 11-bit information bits corresponding to the greatest correlation value stored finally.

Now, in an embodiment, an encoding apparatus and method in which both a (32, 11) code and a (20, 13) code are supported by one encoder using a (32, 11) code generator matrix composed of basis sequences according to the above-described generation method will be described.

A (32, 11) encoder encodes 11-bit information bits and outputs 32 encoded symbols. In order to support a (20, 11) encoder outputting 20 encoded symbols by using the (32, 11) encoder, 12 symbols may be perforated. However, the minimum Hamming distance of the block code may be greatly varied depending on perforation positions, and this may cause a considerable variation in the performance of error correction codes. Therefore, it is important to find an optimal perforation position to minimize performance degradation.

Table 3 shows the comparison of bounds of the minimum Hamming distance according to an input bit number when the (20, 13) code is used as disclosed in the above reference document, and the minimum Hamming distances of the (20, 13) code according to an embodiment of the present disclosure. When the (20, 11) code is made through perforation of the (32, 11) code, and when an input bit is 11 bits, 10 bits, 9 bits, 8 bits, 7 bits, 6 bits, 5 bits, or 4 bits as shown in Table 3, perforation positions having the optimal minimum Hamming distance can be obtained. In this case, such a perforation position may have several patterns. In order to efficiently use the (20, 11) encoder as above, it may be effective to permute the code symbol columns so that all the columns corresponding to the perforation positions move to the back of the code symbols and thus non-perforated code symbols are located in front.

TABLE 3

| | Input bit number | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| Bound | 20 | 13 | 11 | 10 | 9 | 8 | 8 | 8 | 7 | 6 | 5 | 4 | 4 |
| (20, 13) code in this disclosure | 20 | 13 | 11 | 8 | 8 | 8 | 6 | 6 | 6 | 6 | 4 | 4 | 4 |

When the input bit is 3 bits in Table 3, the minimum Hamming distance may be different from the bound in case of the encoder using the (20, 11) code generated by perforating the (32, 11) code. In this case of a 3-bit input, the use of a (7, 3) simplex code is most efficient in order to obtain an optimal minimum Hamming distance. It is therefore desirable to insert the (7, 3) simplex code into the perforated (20, 11) code so that the code is operated as the (7, 3) simplex code when the 3-bit information bits are inputted. Similarly, it is desirable to set a (3, 2) simplex code to be used in case of a 2-bit input and set a repetition encoder to be used in case of a 1-bit input.

After the (32, 11) code is subjected to column permutation so as to have the structure as described above, the (20, 13) code is generated by adding two basis sequences for optimizing the minimum Hamming distance when the input bit is 12 bits or 13 bits in Table 3, into the generator polynomial of the (20, 11) code generated by perforation.

Conditions for obtaining the column permutation function for generating the (20, 13) code in the (32, 11) code are as shown in the following conditions 1 to 5.

<Condition 1>

When 12-bit perforation is performed in the (32, 11) code, find perforation positions where the minimum Hamming distance is optimal when the input bit is 4 bits to 11 bits, and transfer symbols corresponding to the perforation positions to the back.

<Condition 2>

Column-permute seven symbol positions to the forefront so that code symbols corresponding to the 3-bit information bits, among non-perforated symbols, form the (7, 3) simplex code.

<Condition 3>

Column-permute again three symbol positions to the forefront so that code symbols corresponding to the 2-bit information bits, among the symbols disposed at the forefront, form the (3, 2) simplex code.

<Condition 4>

Column-permute again a symbol position to the forefront so that one code symbol corresponding to the 1-bit information bit, among the symbols disposed at the forefront, forms a repetition code.

<Condition 5>

When an input signal is 12-bit or 13-bit in the perforated (20, 11) code, find and add two additional basis sequences in which the minimum Hamming distance is optimized.

The column permutation function P(i) that satisfies the above conditions 1 to 4 is obtained, for example, as shown in Table 4 below.

TABLE 4

| i | P(i) |
|---|---|
| 0 | 20 |
| 1 | 21 |

TABLE 4-continued

| i | P(i) |
|---|---|
| 2 | 1 |
| 3 | 0 |
| 4 | 3 |
| 5 | 2 |
| 6 | 4 |
| 7 | 5 |
| 8 | 22 |
| 9 | 6 |
| 10 | 23 |
| 11 | 7 |
| 12 | 24 |
| 13 | 8 |
| 14 | 9 |
| 15 | 25 |
| 16 | 10 |
| 17 | 11 |
| 18 | 26 |
| 19 | 27 |
| 20 | 12 |
| 21 | 13 |
| 22 | 14 |
| 23 | 15 |
| 24 | 28 |
| 25 | 16 |
| 26 | 29 |
| 27 | 17 |
| 28 | 18 |
| 29 | 30 |
| 30 | 31 |
| 31 | 19 |

When the (32, 11) code according to an embodiment is permuted by means of the column permutation function as shown in Table 4, codes satisfying the conditions 1 to 4 are generated. Referring to Table 4, since the value of P(i) is 20 when i is 0, sequence values located at the 0th in eleven basis sequences of the (32, 11) code are transferred to the 20th position. Also, since the value of P(i) is 21 when i is 1, sequence values located at the first in eleven basis sequences of the (32, 11) code are transferred to the 21st position. Also, since the value of P(i) is 1 when i is 2, sequence values located at the second in eleven basis sequences of the (32, 11) code are transferred to the first position. In the same manner, the positions of all 32 sequences are permuted by the column permutation function P(i), so that the (32, 11) code satisfying the above conditions 1 to 4 is generated as follows.

$M_{i,0}$=10100111100101011101010001010010
$M_{i,1}$=11001101010000110101000101110101
$M_{i,2}$=00111100110011110011000011000011
$M_{i,3}$=00000111100000011110011110011111
$M_{i,4}$=00000000001111111111000000111111
$M_{i,5}$=11111111111111111111111111111111
$M_{i,6}$=11101010100010011000100110010101
$M_{i,7}$=01011111000001111011000101010010
$M_{i,8}$=00010110110010100001000111111101
$M_{i,9}$=00100110000111001111001011100011
$M_{i,10}$=10100001001000011011001101111101

Further, two additional basis sequences that satisfy the above condition 5 with respect to the (32, 11) code column-permuted according to the above conditions 1 to 4 are obtained, for example, as follows.

$M_{i,11}$=11010000100000000000000000000000
$M_{i,12}$=11000010000000010000000000000000

From thirteen basis sequences as above, the (32, 13) code is generated. In case of using code symbols of the first 20 columns according to the condition 1, the (20, 13) code is formed, and the minimum Hamming distance thereof is as shown in Table 3 above.

A generator matrix when the (32, 13) code obtained by the above-described method is used as the (32, 11) code and the (20, 13) code is shown in FIGS. 10A to 10E, each of which shows, by a dotted line, different regions used according to input bit numbers or code sizes in the same (32, 13) code generator matrix.

A process of encoding information by using the same generator matrix as shown in FIGS. 10A to 10E is expressed by Equation 2 below.

$$C_i = \sum_{n=0}^{k-1} a_n \cdot M_{t,n},$$ Equation 2

Here, i=0, 1, 2, ..., B−1. Also, t=i mode($2^k$−1) when k<4, and t=i when k≥4.

When k, the number of input bits $a_n$, is 3 bits being smaller than 4 in Equation 2, a process of generating a code symbol $C_i$ is as follows. Since the input bit number is 3, the modulo operation is performed by $2^3$−1=7 for a code symbol variable i and repeatedly operated in seven units for a code symbol variable t of the basis sequence. Therefore, the operations on the initial seven symbols of the code basis sequence, i.e., on the (7, 3) simplex codeword, are repeatedly performed until final code symbols are outputted as B in number. The number of final code symbols, B, is 32 in case of the (32, 11) code and 20 in case of the (20, 13) code.

In addition, when k, the number of input bits $a_n$, is 2 bits being smaller than 4, a process of generating a code symbol $C_i$ is as follows. Since the input bit number is 2, the modulo operation is performed by $2^2$−1=3 for the code symbol variable i and repeatedly operated in three units for the code symbol variable t of the basis sequence. Therefore, the operations on the initial three symbols of the code basis sequence, i.e., on the (3, 2) simplex codeword, are repeatedly performed until final code symbols are outputted as B in number.

On the other hand, when k is greater than or equal to 4, the code symbol variables t and i are equal to each other, and an encoder operation with input signals is performed for the entire basis sequence.

Figure 11:
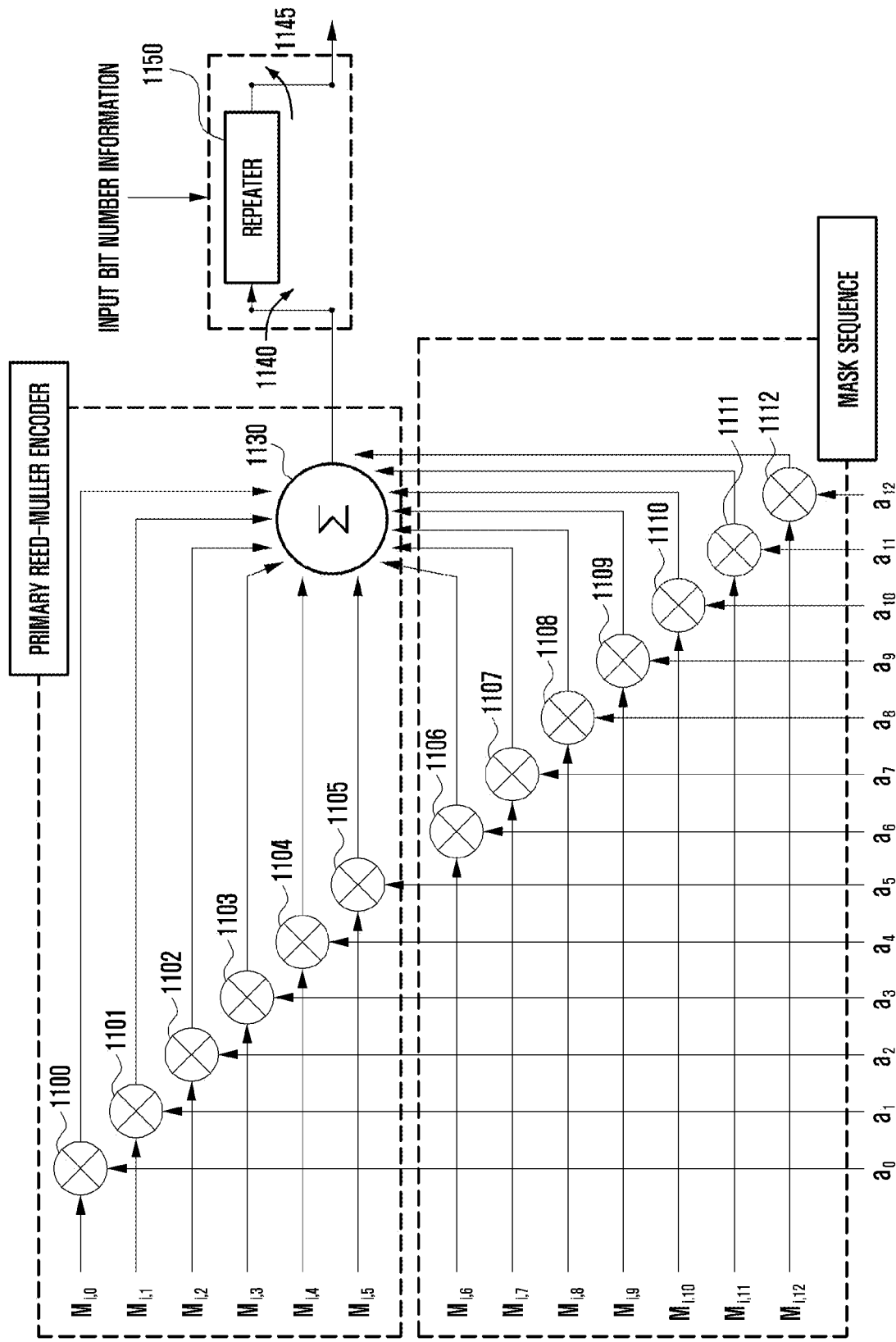
FIG. 11 is a diagram illustrating a code generation method according to the present disclosure.

The encoder operation according to the code generator matrix in an embodiment will be described with reference to FIG. 11. Further, since the encoder operation may vary depending on the input information bit number and the code size, the following description will be made with reference to FIGS. 10A to 10E.

FIG. 10A is a diagram illustrating a generator polynomial of an encoder operating with a (32, 11) code when input information bits are from 4 bits to 11 bits.

When eleven information bits, $a_0$, $a_1$, $a_2$, $a_3$, $a_4$, $a_5$, $a_6$, $a_7$, $a_8$, $a_9$, and $a_{10}$, are inputted into the encoder, the first information bit $a_0$ is inputted into a multiplier 1100. Similarly, the second information bit $a_1$ is inputted into a multiplier 1101, the third information bit $a_2$ into a multiplier 1102, the fourth information bit $a_3$ into a multiplier 1103, the fifth information bit $a_4$ into a multiplier 1104, the sixth information bit $a_5$ into a multiplier 1105, the seventh information bit $a_6$ into a multiplier 1106, the eighth information bit $a_7$ into a multiplier 1107, the ninth information bit $a_8$ into a multiplier 1108, the tenth information bit $a_9$ into a multiplier 1109, and the eleventh information bit $a_{10}$ into a multiplier 1110.

Thereafter, the first bit of the basis sequence $M_{i,0}$ is inputted into the multiplier 1100, multiplied by the information bit $a_0$, and then applied to an adder 1130. Similarly, the first bit of the basis sequence $M_{i,1}$ is inputted into the multiplier 1101, multiplied by the information bit $a_1$, and then applied to the adder 1130. Also, the first bit of the basis sequence $M_{i,2}$ is inputted into the multiplier 1102, multiplied by the information bit $a_2$, and then applied to the adder 1130. Also, the first bit of the basis sequence $M_{i,3}$ is inputted into the multiplier 1103, multiplied by the information bit $a_3$, and then applied to the adder 1130. Also, the first bit of the basis sequence $M_{i,4}$ is inputted into the multiplier 1104, multiplied by the information bit $a_4$, and then applied to the adder 1130. Also, the first bit of the basis sequence $M_{i,5}$ is inputted into the multiplier 1105, multiplied by the information bit $a_5$, and then applied to the adder 1130. Also, the first bit of the basis sequence $M_{i,6}$ is inputted into the multiplier 1106, multiplied by the information bit $a_6$, and then applied to the adder 1130. Also, the first bit of the basis sequence $M_{i,7}$ is inputted into the multiplier 1107, multiplied by the information bit $a_7$, and then applied to the adder 1130. Also, the first bit of the basis sequence $M_{i,8}$ is inputted into the multiplier 1108, multiplied by the information bit $a_8$, and then applied to the adder 1130. Also, the first bit of the basis sequence $M_{i,9}$ is inputted into the multiplier 1109, multiplied by the information bit $a_9$, and then applied to the adder 1130. And also, the first bit of the basis sequence $M_{i,10}$ is inputted into the multiplier 1110, multiplied by the information bit $a_{10}$, and then applied to the adder 1130.

Thereafter, the adder 1130 exclusively adds the signals inputted from the multipliers 1100, 1101, 1102, 1103, 1104, 1105, 1106, 1107, 1108, 1109, and 1110 and thereby outputs a first code symbol. Also, the second bits of the basis sequences $M_{i,k}$ are calculated respectively in the same manner as described above, and a second code symbol is outputted from the adder 1130. This operation is repeated thirty-two times corresponding to the length of the basis code, and thereby code symbols having a length of 32 are outputted. Then, the code symbols having a length of 32 and outputted from the adder 1130 are applied to a switch 1140, and the switch 1140 receives the input bit number information. If the number of input information bits is greater than or equal to 4 bits, the switch 1140 cuts off the connection with a repeater 1150 and outputs the thirty-two code symbols as final code symbols.

The above encoding method according to an embodiment shows a case in which eleven information bits are inputted. If information bits smaller in number than 11 bits are inputted, only bits corresponding to the number of input information bits are inputted into the multipliers, and the multiplier corresponding to a non-input portion is controlled not to operate. For example, when six information bits are inputted, the first information bit $a_0$ is inputted into the multiplier 1100, the second information bit $a_1$ into the multiplier 1101, the third information bit $a_2$ into the multiplier 1102, the fourth information bit $a_3$ into the multiplier 1103, the fifth information bit $a_4$ into the multiplier 1104, and the sixth information bit $a_5$ into the multiplier 1105. The remaining multipliers 1106, 1107, 1108, 1109, and 1110 are controlled so as not to operate.

Thereafter, the first bit of the basis sequence $M_{i,0}$ is inputted into the multiplier 1100, multiplied by the information bit $a_0$, and then applied to the adder 1130. Also, the first bit of the basis sequence $M_{i,1}$ is inputted into the multiplier 1101, multiplied by the information bit $a_1$, and then applied to the adder 1130. Also, the first bit of the basis sequence $M_{i,2}$ is inputted into the multiplier 1102, multiplied by the information bit $a_2$, and then applied to the adder 1130. Also, the first bit of the basis sequence $M_{i,3}$ is inputted into the multiplier 1103, multiplied by the information bit $a_3$, and then applied to the adder 1130. Also, the first bit of the basis sequence $M_{i,4}$ is inputted into the multiplier 1104, multiplied by the information bit $a_4$, and then applied to the adder 1130. And also, the first bit of the basis sequence $M_{i,5}$ is inputted into the multiplier 1105, multiplied by the information bit $a_5$, and then applied to the adder 1130. Then, the adder 1130 exclusively adds the signals inputted from the multipliers 1100, 1101, 1102, 1103, 1104, and 1105 and thereby outputs a first code symbol. In addition, the second bits of the basis sequences $M_{i,k}$ are calculated respectively in the same manner, and a second code symbol is outputted from the adder 1130. This operation is repeated thirty-two times corresponding to the length of the basis code, and thereby code symbols having a length of 32 are outputted. Then, the code symbols having a length of 32 and outputted from the adder 1130 are applied to the switch 1140, and the switch 1140 receives the input bit number information. If the number of input information bits is greater than or equal to 4 bits, the switch 1140 cuts off the connection with the repeater 1150 and outputs the thirty-two code symbols as final code symbols.

FIG. 10B is a diagram illustrating a generator polynomial of an encoder operating with a (20, 13) code when input information bits are from 4 bits to 13 bits.

When thirteen information bits, $a_0$, $a_1$, $a_2$, $a_3$, $a_4$, $a_5$, $a_6$, $a_7$, $a_8$, $a_9$, $a_{10}$, $a_{11}$, and $a_{12}$, are inputted into the encoder, the first information bit $a_0$ is inputted into a multiplier 1100. Similarly, the second information bit $a_1$ is inputted into a multiplier 1101, the third information bit $a_2$ into a multiplier 1102, the fourth information bit $a_3$ into a multiplier 1103, the fifth information bit $a_4$ into a multiplier 1104, the sixth information bit $a_5$ into a multiplier 1105, the seventh information bit $a_6$ into a multiplier 1106, the eighth information bit $a_7$ into a multiplier 1107, the ninth information bit $a_8$ into a multiplier 1108, the tenth information bit $a_9$ into a multiplier 1109, the eleventh information bit $a_{10}$ into a multiplier 1110, the twelfth information bit $a_{11}$ into a multiplier 1111, and the thirteenth information bit $a_{12}$ into a multiplier 1112.

Thereafter, the first bit of the basis sequence $M_{i,0}$ is inputted into the multiplier 1100, multiplied by the information bit $a_0$, and then applied to the adder 1130. Similarly, the first bit of the basis sequence $M_{i,1}$ is inputted into the multiplier 1101, multiplied by the information bit $a_1$, and then applied to the adder 1130. Also, the first bit of the basis sequence $M_{i,2}$ is inputted into the multiplier 1102, multiplied by the information bit $a_2$, and then applied to the adder 1130. Also, the first bit of the basis sequence $M_{i,3}$ is inputted into the multiplier 1103, multiplied by the information bit $a_3$, and then applied to the adder 1130. Also, the first bit of the basis sequence $M_{i,4}$ is inputted into the multiplier 1104, multiplied by the information bit $a_4$, and then applied to the adder 1130. Also, the first bit of the basis sequence $M_{i,5}$ is inputted into the multiplier 1105, multiplied by the information bit $a_5$, and then applied to the adder 1130. Also, the first bit of the basis sequence $M_{i,6}$ is inputted into the multiplier 1106, multiplied by the information bit $a_6$, and then applied to the adder 1130. Also, the first bit of the basis sequence $M_{i,7}$ is inputted into the multiplier 1107, multiplied by the information bit $a_7$, and then applied to the adder 1130. Also, the first bit of the basis sequence $M_{i,8}$ is inputted into the multiplier 1108, multiplied by the information bit $a_8$, and then applied to the adder 1130. Also, the first bit of the basis sequence $M_{i,9}$ is inputted into the multiplier 1109, multiplied by the information bit $a_9$, and then applied to the adder 1130. Also, the first bit of the basis sequence $M_{i,10}$ is inputted into the multiplier 1110, multiplied by the information bit $a_{10}$, and then applied to the adder 1130. Also, the first bit of the basis sequence $M_{i,11}$ is inputted into the multiplier 1111, multiplied by the information bit $a_{11}$, and then applied to the adder 1130. And also, the first bit of the basis sequence $M_{i,12}$ is inputted into the multiplier 1112, multiplied by the information bit $a_{12}$, and then applied to the adder 1130.

Thereafter, the adder 1130 exclusively adds the signals inputted from the multipliers 1100, 1101, 1102, 1103, 1104, 1105, 1106, 1107, 1108, 1109, 1110, 1111, and 1112, and thereby outputs a first code symbol. Also, the second bits of the basis sequences $M_{i,k}$ are calculated respectively in the same manner as described above, and a second code symbol is outputted from the adder 1130. This operation is repeated twenty times corresponding to the length of the basis code, and thereby code symbols having a length of 20 are outputted. Then, the code symbols having a length of 20 and outputted from the adder 1130 are applied to the switch 1140, and the switch 1140 receives the input bit number information. If the number of input information bits is greater than or equal to 4 bits, the switch 1140 cuts off the connection with the repeater 1150 and outputs the twenty code symbols as final code symbols.

The above encoding method according to an embodiment shows a case in which thirteen information bits are inputted. If information bits smaller in number than 13 bits are inputted, only bits corresponding to the number of input information bits are inputted into the multipliers, and the multiplier corresponding to a non-input portion is controlled not to operate. For example, when six information bits are inputted, the first information bit $a_0$ is inputted into the multiplier 1100, the second information bit $a_1$ into the multiplier 1101, the third information bit $a_2$ into the multiplier 1102, the fourth information bit $a_3$ into the multiplier 1103, the fifth information bit $a_4$ into the multiplier 1104, and the sixth information bit $a_5$ into the multiplier 1105. The remaining multipliers 1106, 1107, 1108, 1109, and 1110 are controlled so as not to operate. Thereafter, the first bit of the basis sequence $M_{i,0}$ is inputted into the multiplier 1100, multiplied by the information bit $a_0$, and then applied to the adder 1130. Also, the first bit of the basis sequence $M_{i,1}$ is inputted into the multiplier 1101, multiplied by the information bit $a_1$, and then applied to the adder 1130. Also, the first bit of the basis sequence $M_{i,2}$ is inputted into the multiplier 1102, multiplied by the information bit $a_2$, and then applied to the adder 1130. Also, the first bit of the basis sequence $M_{i,3}$ is inputted into the multiplier 1103, multiplied by the information bit $a_3$, and then applied to the adder 1130. Also, the first bit of the basis sequence $M_{i,4}$ is inputted into the multiplier 1104, multiplied by the information bit $a_4$, and then applied to the adder 1130. And also, the first bit of the basis sequence $M_{i,5}$ is inputted into the multiplier 1105, multiplied by the information bit $a_5$, and then applied to the adder 1130.

Then, the adder 1130 exclusively adds the signals inputted from the multipliers 1100, 1101, 1102, 1103, 1104, and 1105 and thereby outputs a first code symbol. In addition, the second bits of the basis sequences $M_{i,k}$ are calculated respectively in the same manner, and a second code symbol is outputted from the adder 1130. This operation is repeated twenty times corresponding to the length of the basis code, and thereby code symbols having a length of 20 are outputted.

Then, the code symbols having a length of 20 and outputted from the adder 1130 are applied to the switch 1140, and the switch 1140 receives the input bit number information. If the number of input information bits is greater than or equal to 4 bits, the switch 1140 cuts off the connection with the repeater 1150 and outputs the twenty code symbols as final code symbols.

FIG. 10C is a diagram illustrating the entire generator matrix for generating a (7, 3) simplex code and a dotted line portion thereof used when 3-bit input information bits are inputted. In addition, FIG. 11 represents a generator polynomial of the encoder that operates to repeat a 7-symbol simplex codeword generated through the above generator matrix by the final code length. Hereinafter, the operation when the encoder operates with the (32, 3) code will be described.

When three information bits, $a_0$, $a_1$, and $a_2$, are inputted into the encoder, the first information bit $a_0$ is inputted into the multiplier 1100, the second information bit $a_1$ is inputted into the multiplier 1101, and the third information bit $a_2$ is inputted into the multiplier 1102.

Then, the first bit of the basis sequence $M_{i,0}$ is inputted into the multiplier 1100, multiplied by the information bit $a_0$, and then applied to the adder 1130. Similarly, the first bit of the basis sequence $M_{i,1}$ is inputted into the multiplier 1101, multiplied by the information bit $a_1$, and then applied to the adder 1130. Also, the first bit of the basis sequence $M_{i,2}$ is inputted into the multiplier 1102, multiplied by the information bit $a_2$, and then applied to the adder 1130. Thereafter, the adder 1130 exclusively adds the signals inputted from the multipliers 1100, 1101, and 1102, and thereby outputs a first code symbol. Also, the second bits of the basis sequences $M_{i,k}$ are calculated respectively in the same manner, and a second code symbol is outputted from the adder 1130. This operation is repeated seven times corresponding to the length of the basis code, and thereby (7, 3) simplex code symbols having a length of 7 are outputted.

Thereafter, the code symbols having a length of 7 and outputted from the adder 1130 are applied to the switch 1140, and the switch 1140 receives the input bit number information. Since the number of input information bits is 3 bits, the switch 1140 connects the output of the adder 1130 to the repeater 1150. The repeater 1150 sequentially repeats the inputted seven symbols until the final output becomes 32 symbols. That is, the repeater generates 32 symbols by repeating the symbols four times and further using additional four symbols. The remaining three symbols are not used. Then, the switch 1145 connects the repeater 1150 to the final output end and outputs the final 32 code symbols.

The above-described encoding operation for (32, 3) is an example of encoding three information bits. In case of operating with (20, 3), the operation is the same as above until the seven (7, 3) simplex codes are inputted into the repeater 1150. Then, the repeater 1150 sequentially repeats the inputted seven symbols until the final output becomes 20 symbols. That is, the repeater generates 20 symbols by repeating the symbols two times and further using additional six symbols. The remaining one symbol is not used. Then, the switch 1145 connects the repeater 1150 to the final output end and outputs the final 20 code symbols.

FIG. 10D is a diagram illustrating the entire generator matrix for generating a (3, 2) simplex code and a dotted line portion thereof used when 2-bit input information bits are inputted. In addition, FIG. 11 represents a generator polynomial of the encoder that operates to repeat a 3-symbol simplex codeword generated through the above generator matrix by the final code length. Hereinafter, the operation when the encoder operates with the (32, 2) code will be described.

When two information bits, $a_0$ and $a_1$, are inputted into the encoder, the first information bit $a_0$ is inputted into the multiplier 1100, and the second information bit $a_1$ is inputted into the multiplier 1101.

Then, the first bit of the basis sequence $M_{i,0}$ is inputted into the multiplier 1100, multiplied by the information bit $a_0$, and then applied to the adder 1130. Also, the first bit of the basis sequence $M_{i,1}$ is inputted into the multiplier 1101, multiplied by the information bit $a_1$, and then applied to the adder 1130. The adder 1130 exclusively adds the signals inputted from the multipliers 1100 and 1101, and thereby outputs a first code symbol. Also, the second bits of the basis sequences $M_{i,k}$ are calculated respectively in the same manner, and a second code symbol is outputted from the adder 1130. This operation is repeated three times corresponding to the length of the basis code, and thereby (3, 2) simplex code symbols having a length of 3 are outputted.

Thereafter, the code symbols having a length of 3 and outputted from the adder 1130 are applied to the switch 1140, and the switch 1140 receives the input bit number information. Since the number of input information bits is 2 bits, the switch 1140 connects the output of the adder 1130 to the repeater 1150. The repeater 1150 sequentially repeats the inputted three symbols until the final output becomes 32 symbols. That is, the repeater generates 32 symbols by repeating the symbols ten times and further using additional two symbols. The remaining one symbol may be omitted. Then, the switch 1145 connects the repeater 1150 to the final output end and outputs the final 32 code symbols.

The above-described encoding operation for (32, 2) is an example of encoding two information bits. In case of operating with (20, 2), the operation is the same as above until the three (3, 2) simplex codes are inputted into the repeater 1150. Then, the repeater 1150 sequentially repeats the inputted three symbols until the final output becomes 20 symbols. That is, the repeater generates 20 symbols by repeating the symbols six times and further using additional two symbols. The remaining one symbol is not used. Then, the switch 1145 connects the repeater 1150 to the final output end and outputs the final 20 code symbols.

FIG. 10E is a diagram illustrating the entire generator matrix for generating a (1, 1) repetition code and a dotted line portion thereof used when 1-bit input information bit is inputted. In addition, FIG. 11 represents a generator polynomial of the encoder that operates to repeat a 1-symbol simplex codeword generated through the above generator matrix by the final code length. Hereinafter, the operation when the encoder operates with the (32, 1) code will be described.

When one information bit, $a_0$, is inputted into the encoder, the first information bit $a_0$ is inputted into the multiplier 1100.

Then, the first bit of the basis sequence $M_{i,0}$ is inputted into the multiplier 1100, multiplied by the information bit $a_0$, and then applied to the adder 1130. The adder 1130 outputs the signal inputted from the multiplier 1100 as a first code symbol. The code symbol having a length of 1 and outputted from the adder 1130 is applied to the switch 1140, and the switch 1140 receives the input bit number information. Since the number of input information bits is 1 bit, the switch 1140 connects the output of the adder 1130 to the repeater 1150. Then, the repeater 1150 sequentially repeats the inputted one symbol until the final output becomes 32 symbols. Then, the switch 1145 connects the repeater 1150 to the final output end and outputs the final 32 code symbols.

The above-described encoding operation for (32, 1) is an example of encoding one information bit. In case of operating with (20, 1), the operation is the same as above until the one (1, 1) simplex code is inputted into the repeater 1150. Then, the repeater 1150 sequentially repeats the inputted one symbol until the final output becomes 20 symbols. Then, the switch 1145 connects the repeater 1150 to the final output end and outputs the final 20 code symbols.

Figure 12:
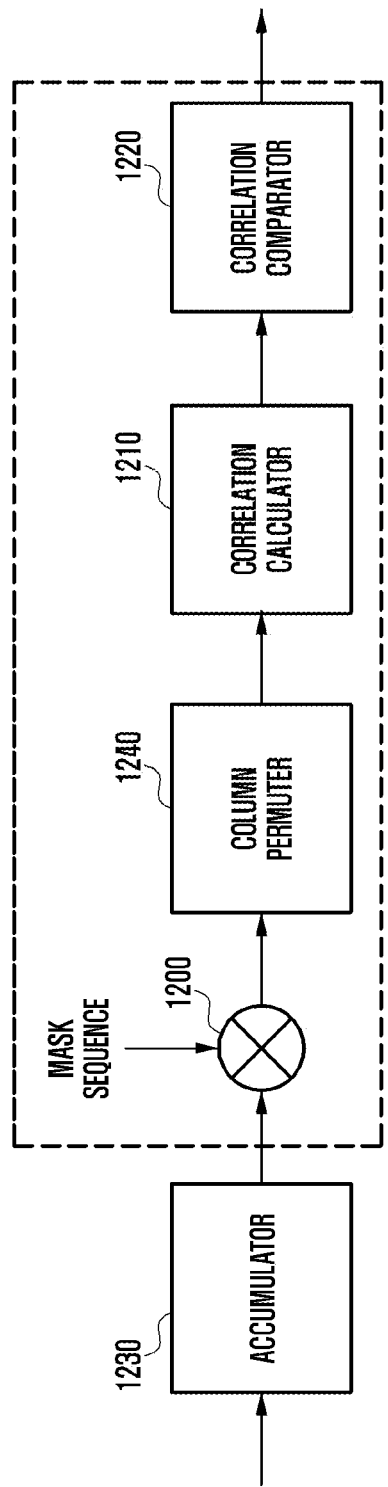
FIG. 12 is a diagram illustrating a decoder operation according to an embodiment of the present disclosure.

FIG. 12 is a diagram illustrating a decoder operation according to an embodiment of the present disclosure. The difference between the decoder of FIG. 12 according to an embodiment and the decoder of FIG. 9 according to another embodiment is an accumulator 1230 and a column permuter 1240 shown in FIG. 12. The accumulator 1230 is used to accumulate code symbols according to repetition of a simplex code or a repetition code when the input information bits are smaller than or equal to 3 bits. For the other input information bits, the input signals are outputted as they are. Meanwhile, since the generator matrix used in an embodiment is column-permuted by the column permutation function P(i) shown in Table 4, the column permuter 1240 performs again the column permutation by using the inverse function of the column permutation function in order to make an array to be inputted into a correlation calculator corresponding to the primary Reed-Muller code. Also, the column permuter performs an operation of inserting a 0 value into perforation positions in case of operating with the (20, 13) code as shown in FIG. 10B.

First, the operation of the decoder is described when the code used in the encoder of the transmitter is the (32, 11) generator matrix used in case where the number of information bits is greater than 3 bits and smaller than or equal to 11 bits as shown in FIG. 10A. For example, when the number of information bits is 11 bits, the decoder operation of the improved Reed-Muller code is as follows. When a received signal having a length of 32 is inputted into the decoder, the received signal is inputted into the accumulator 1230. Since the number of information bits is 11 bits, there is no symbol repetition. Therefore, the accumulator 1230 outputs the 32 received signals as they are. The signals outputted from the accumulator 1230 are inputted into a multiplier 1200. The multiplier 1200 multiplies the received signal by one of possible mask sequences in a symbol unit and outputs a resultant signal. At this time, the number of possible mask sequences is $2^5=32$ since the mask sequence is a combination of five mask basis sequences, and one of 32 possible mask sequences is selected and inputted into the multiplier 1200. The 32-symbol signal sequence outputted from the multiplier 1200 is inputted to the column permuter 1240. The column permuter 1240 performs the column permutation on input signals with the inverse function corresponding to the column permutation function P(i) as shown in Table 4, and then outputs a resultant signal sequence to a correlation calculator 1210.

When the signal sequence is inputted into the correlation calculator 1210, the correlation calculator 1210 calculates correlation values between the inputted 32-symbol signal sequence and all primary Reed-Muller codes, and applies the calculated correlation values to a correlation comparator 1220. Then, the correlation comparator 1220 stores the greatest one of the inputted correlation values and corresponding 11-bit information bits. Thereafter, the received signal is inputted again into the multiplier 1200, and a mask sequence other than the previously selected mask sequence among possible mask sequences is inputted into the multiplier 1200. Then, the above operation is repeated. The correlation calculator 1210 calculates the correlation values and applies them to the correlation comparator 1220. The correlation comparator 1220 calculates the greatest one of the correlation values including the previously stored correlation value, and stores it together with corresponding 11-bit information bits. The above operation is repeated for all the 32 mask sequences. After this repetition, the correlation comparator 1220 outputs, as decoded information bits, the 11-bit information bits corresponding to the greatest correlation value stored finally.

Next, the operation of the decoder is described when the code used in the encoder of the transmitter is the (20, 13) generator matrix used in case where the number of information bits is greater than 3 bits and smaller than or equal to 11 bits as shown in FIG. 10B. For example, when the number of information bits is 13 bits, the decoder operation of the improved Reed-Muller code is as follows. When a received signal having a length of 20 is inputted into the decoder, the received signal is inputted into the accumulator 1230. Since the number of information bits is 13 bits, there is no symbol repetition. Therefore, the accumulator 1230 outputs the 20 received signals as they are. The signals outputted from the accumulator 1230 are inputted into the multiplier 1200. The multiplier 1200 multiplies the received signal by one of possible mask sequences in a symbol unit and outputs a resultant signal. At this time, the number of possible mask sequences is $2^7=128$ since the mask sequence is a combination of seven mask basis sequences, and one of 128 possible mask sequences is selected and inputted into the multiplier 1200. The 20-symbol signal sequence outputted from the multiplier 1200 is inputted to the column permuter 1240. The column permuter 1240 performs the column permutation on input signals with the inverse function corresponding to the column permutation function P(i) as shown in Table 4, inserts a 0 value into twelve perforation positions to make a signal having a length of 32, and then outputs a resultant signal sequence to the correlation calculator 1210.

When the signal sequence is inputted into the correlation calculator 1210, the correlation calculator 1210 calculates correlation values between the inputted 32-symbol signal sequence and all primary Reed-Muller codes, and applies the calculated correlation values to the correlation comparator 1220. Then, the correlation comparator 1220 stores the greatest one of the inputted correlation values and corresponding 13-bit information bits. Thereafter, the received signal is inputted again into the multiplier 1200, and a mask sequence other than the previously selected mask sequence among possible mask sequences is inputted into the multiplier 1200. Then, the above operation is repeated. The correlation calculator 1210 calculates the correlation values and applies them to the correlation comparator 1220. The correlation comparator 1220 calculates the greatest one of the correlation values including the previously stored correlation value, and stores it together with corresponding 13-bit information bits. The above operation is repeated for all the 128 mask sequences. After this repetition, the correlation comparator 1220 outputs, as decoded information bits, the 13-bit information bits corresponding to the greatest correlation value stored finally.

Next, the operation of the decoder is described when the code used in the encoder of the transmitter is the (32, 3) generator matrix used in case where the number of information bits is 3 bits as shown in FIG. 10C. When the number of information bits is 3 bits, the decoder operation of the improved Reed-Muller code is as follows. When a received signal having a length of 32 is inputted into the decoder, the received signal is inputted into the accumulator 1230. Since the number of information bits is 3 bits, the first to fourth symbols (four symbols) have five symbol repetitions, and the remaining fifth to seventh symbols (three symbols) have four symbol repetitions. Therefore, the accumulator 1230 accumulates the repeated symbols among the 32 received signals and outputs the accumulated symbols as 7 code symbols. The signals outputted from the accumulator 1230 are inputted into the multiplier 1200. Since no mask sequence is used for encoding when the input information bits are 3 bits, the multiplier 1200 outputs the inputted seven code symbols as they are. The outputted signals are inputted to the column permuter 1240.

Thereafter, the column permuter 1240 performs the column permutation on input signals with the column permutation function for making an array of primary Reed-Muller codes, inserts a 0 value into perforation positions in the primary Reed-Muller codes to make a signal having a length of 8, and then outputs a resultant signal sequence to the correlation calculator 1210. When the signal sequence is inputted into the correlation calculator 1210, the correlation calculator 1210 calculates correlation values between the inputted 8-symbol signal sequence and all primary Reed-Muller codes, and applies the calculated correlation values to the correlation comparator 1220. Then, the correlation comparator 1220 stores the greatest one of the inputted correlation values and corresponding 3-bit information bits. This example assumes the use of the (32, 3) generator matrix. If the (20, 3) generator matrix is used, a received signal having a length of 20 is inputted into the decoder and then inputted into the accumulator 1230. Since the number of information bits is 3 bits, the first to sixth symbols (six symbols) have three symbol repetitions, and the remaining one symbol has two symbol repetitions. Therefore, the accumulator 1230 accumulates the repeated symbols among the 20 received signals and outputs the accumulated symbols as 7 code symbols. The subsequent operation is the same as in case of using the (32, 3) generator matrix.

Next, the operation of the decoder is described when the code used in the encoder of the transmitter is the (32, 2) generator matrix used in case where the number of information bits is 2 bits as shown in FIG. 10D. When the number of information bits is 2 bits, the decoder operation of the improved Reed-Muller code is as follows. When a received signal having a length of 32 is inputted into the decoder, the received signal is inputted into the accumulator 1230. Since the number of information bits is 2 bits, the first and second symbols (two symbols) have eleven symbol repetitions, and the last one symbol has ten symbol repetitions. Therefore, the accumulator 1230 accumulates the repeated symbols among the 32 received signals and outputs the accumulated symbols as 3 code symbols. The signals outputted from the accumulator 1230 are inputted into the multiplier 1200. Since no mask sequence is used for encoding when the input information bits are 2 bits, the multiplier 1200 outputs the inputted three code symbols as they are. The outputted signals are inputted to the column permuter 1240.

Then, the column permuter 1240 performs the column permutation on input signals with the column permutation function for making an array of primary Reed-Muller codes, inserts a 0 value into perforation positions in the primary Reed-Muller codes to make a signal having a length of 4, and then outputs a resultant signal sequence to the correlation calculator 1210. When the signal sequence is inputted into the correlation calculator 1210, the correlation calculator 1210 calculates correlation values between the inputted 4-symbol signal sequence and all primary Reed-Muller codes, and applies the calculated correlation values to the correlation comparator 1220. Then, the correlation comparator 1220 stores the greatest one of the inputted correlation values and corresponding 2-bit information bits. This example assumes the use of the (32, 2) generator matrix. If the (20, 2) generator matrix is used, a received signal having a length of 20 is inputted into the decoder and then inputted into the accumulator 1230. Since the number of information bits is 2 bits, the first and second symbols (two symbols) have seven symbol repetitions, and the last one symbol has six symbol repetitions. Therefore, the accumulator 1230 accumulates the repeated symbols among the 20 received signals and outputs the accumulated symbols as 3 code symbols. The subsequent operation is the same as in case of using the (32, 2) generator matrix.

Finally, the operation of the decoder is described when the code used in the encoder of the transmitter is the (32, 1) generator matrix used in case where the number of information bits is 1 bit as shown in FIG. 10E. When the number of information bits is 1 bit, the decoder operation of the improved Reed-Muller code is as follows. When a received signal having a length of 32 is inputted into the decoder, the received signal is inputted into the accumulator 1230. Since the number of information bits is 1 bit, the symbol have twenty-two symbol repetitions. Therefore, the accumulator 1230 accumulates the 32 received signals and outputs the accumulated symbols as one code symbol. The signals outputted from the accumulator 1230 are inputted into the multiplier 1200. Since no mask sequence is used for encoding when the input information bit is 1 bit, the multiplier 1200 outputs the inputted one code symbol as it is. The outputted signal is inputted to the column permuter 1240.

Since the input information bit is 1 bit, the column permuter 1240 outputs the input signal to the correlation calculator 1210 as it is. When the signal sequence is inputted into the correlation calculator 1210, the correlation calculator 1210 calculates correlation values between the inputted 1-symbol signal sequence and all primary Reed-Muller codes having a length of 1, and applies the calculated correlation values to the correlation comparator 1220. Then, the correlation comparator 1220 stores the greatest one of the inputted correlation values and corresponding 1-bit information bits. This example assumes the use of the (32, 1) generator matrix. If the (20, 1) generator matrix is used, a received signal having a length of 20 is inputted into the decoder and then inputted into the accumulator 1230. Since the number of information bits is 1 bit, one symbol has twenty symbol repetitions. Therefore, the accumulator 1230 accumulates the 20 received signals and outputs one code symbol. The subsequent operation is the same as in case of using the (32, 1) generator matrix.

As described above, the method and apparatus according to embodiments of the present disclosure may result in excellent performance by maximizing the minimum Hamming distance theoretically for transmission of a small information bit such as a control channel, and also reduce the complexity of the decoder by using the low decoding complexity of the Reed-Muller code.

While the present disclosure has been particularly shown and described with reference to embodiments thereof, it is clearly understood that the same is by way of illustration and example only and is not to be taken in conjunction with the present disclosure. It will be understood by those skilled in the art that various changes in form and details may be made therein without departing from the subject matter and scope of the present disclosure.

Although the present disclosure has been described with various embodiments, various changes and modifications may be suggested to one skilled in the art. It is intended that the present disclosure encompass such changes and modifications as fall within the scope of the appended claims.

What is claimed is:

1. A method for encoding information bits, the method comprising:
   identifying the information bits;
   encoding the information bits by using a block code; and
   obtaining a codeword as a result of the encoding,
   wherein:
   a length of the information bits is a maximum of 13 bits,
   the block code is composed of a Walsh basis sequence and a mask basis sequence, and
   the block code is as follows:

| i | $M_{i,0}$ | $M_{i,1}$ | $M_{i,2}$ | $M_{i,3}$ | $M_{i,4}$ | $M_{i,5}$ | $M_{i,6}$ |
|---|---|---|---|---|---|---|---|
| 0 | 1 | 1 | 0 | 0 | 0 | 1 | 1 |
| 1 | 0 | 1 | 0 | 0 | 0 | 1 | 1 |
| 2 | 1 | 0 | 1 | 0 | 0 | 1 | 1 |
| 3 | 0 | 0 | 1 | 0 | 0 | 1 | 1 |
| 4 | 0 | 1 | 1 | 0 | 0 | 1 | 0 |
| 5 | 1 | 1 | 1 | 0 | 0 | 1 | 1 |
| 6 | 1 | 0 | 0 | 1 | 0 | 1 | 0 |
| 7 | 1 | 1 | 0 | 1 | 0 | 1 | 1 |
| 8 | 1 | 0 | 1 | 1 | 0 | 1 | 0 |
| 9 | 0 | 1 | 1 | 1 | 0 | 1 | 1 |
| 10 | 0 | 0 | 0 | 0 | 1 | 1 | 0 |
| 11 | 1 | 0 | 0 | 0 | 1 | 1 | 0 |
| 12 | 0 | 0 | 1 | 0 | 1 | 1 | 0 |
| 13 | 1 | 0 | 1 | 0 | 1 | 1 | 1 |
| 14 | 0 | 1 | 1 | 0 | 1 | 1 | 0 |
| 15 | 1 | 1 | 1 | 0 | 1 | 1 | 0 |
| 16 | 1 | 0 | 0 | 1 | 1 | 1 | 1 |
| 17 | 1 | 1 | 0 | 1 | 1 | 1 | 1 |
| 18 | 0 | 0 | 1 | 1 | 1 | 1 | 0 |
| 19 | 1 | 1 | 1 | 1 | 1 | 1 | 0 |
| 20 | 0 | 0 | 0 | 0 | 0 | 1 | 0 |
| 21 | 1 | 0 | 0 | 0 | 0 | 1 | 1 |
| 22 | 0 | 0 | 0 | 1 | 0 | 1 | 0 |
| 23 | 0 | 1 | 0 | 1 | 0 | 1 | 0 |
| 24 | 0 | 0 | 1 | 1 | 0 | 1 | 1 |
| 25 | 1 | 1 | 1 | 1 | 0 | 1 | 1 |
| 26 | 0 | 1 | 0 | 0 | 1 | 1 | 0 |
| 27 | 1 | 1 | 0 | 0 | 1 | 1 | 1 |
| 28 | 0 | 0 | 0 | 1 | 1 | 1 | 0 |
| 29 | 0 | 1 | 0 | 1 | 1 | 1 | 1 |
| 30 | 1 | 0 | 1 | 1 | 1 | 1 | 0 |
| 31 | 0 | 1 | 1 | 1 | 1 | 1 | 1 |

| i | $M_{i,7}$ | $M_{i,8}$ | $M_{i,9}$ | $M_{i,10}$ | $M_{i,11}$ | $M_{i,12}$ |
|---|---|---|---|---|---|---|
| 0 | 0 | 0 | 0 | 1 | 1 | 1 |
| 1 | 1 | 0 | 0 | 0 | 1 | 1 |
| 2 | 0 | 0 | 1 | 1 | 0 | 0 |
| 3 | 1 | 1 | 0 | 0 | 1 | 0 |
| 4 | 1 | 0 | 0 | 0 | 0 | 0 |
| 5 | 1 | 1 | 1 | 0 | 0 | 0 |
| 6 | 1 | 1 | 1 | 0 | 0 | 1 |
| 7 | 1 | 0 | 0 | 1 | 0 | 0 |
| 8 | 0 | 1 | 0 | 0 | 1 | 0 |
| 9 | 0 | 1 | 0 | 0 | 0 | 0 |
| 10 | 0 | 0 | 0 | 1 | 0 | 0 |
| 11 | 0 | 0 | 1 | 0 | 0 | 0 |
| 12 | 0 | 1 | 1 | 0 | 0 | 0 |
| 13 | 1 | 0 | 1 | 0 | 0 | 0 |
| 14 | 1 | 1 | 0 | 0 | 0 | 0 |
| 15 | 1 | 0 | 0 | 1 | 0 | 1 |
| 16 | 1 | 0 | 1 | 1 | 0 | 0 |
| 17 | 0 | 0 | 1 | 0 | 0 | 0 |
| 18 | 1 | 0 | 1 | 1 | 0 | 0 |
| 19 | 1 | 1 | 1 | 1 | 0 | 0 |
| 20 | 0 | 0 | 0 | 0 | 0 | 0 |
| 21 | 0 | 0 | 0 | 0 | 0 | 0 |
| 22 | 0 | 0 | 1 | 1 | 0 | 0 |
| 23 | 1 | 1 | 0 | 1 | 0 | 0 |
| 24 | 0 | 1 | 1 | 0 | 0 | 0 |
| 25 | 1 | 1 | 1 | 1 | 0 | 0 |
| 26 | 0 | 1 | 1 | 1 | 0 | 0 |
| 27 | 1 | 1 | 0 | 1 | 0 | 0 |
| 28 | 0 | 1 | 0 | 1 | 0 | 0 |
| 29 | 0 | 1 | 0 | 1 | 0 | 0 |
| 30 | 1 | 0 | 1 | 0 | 0 | 0 |
| 31 | 0 | 1 | 1 | 1 | 0 | 0. |

2. The method of claim 1, wherein in a case that the length of the information bits is 13 bits, rows from i=0 to i=19 and columns from $M_{i,0}$ to $M_{i,12}$ in the block code are used for the encoding.

3. The method of claim 1, wherein in a case that the length of the information bits is 3 bits, rows from i=0 to i=6 and columns from $M_{i,0}$ to $M_{i,12}$ in the block code are used for the encoding.

4. A method for decoding an input signal, the method comprising:
   receiving the input signal;
   decoding the input signal based on a block code; and
   obtaining information bits as a result of the decoding,
   wherein:
   a length of the information bits is a maximum of 13 bits,
   the block code is composed of a Walsh basis sequence and a mask basis sequence, and
   the block code is as follows:

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 1 | 1 | 0 | 0 | 0 | 1 | 1 | 1 |
| 1 | 0 | 1 | 0 | 0 | 0 | 1 | 1 | 1 | 0 | 0 | 0 | 1 | 1 |
| 2 | 1 | 0 | 1 | 0 | 0 | 1 | 1 | 0 | 0 | 1 | 1 | 0 | 0 |
| 3 | 0 | 0 | 1 | 0 | 0 | 1 | 1 | 1 | 1 | 0 | 0 | 1 | 0 |
| 4 | 0 | 1 | 1 | 0 | 0 | 1 | 0 | 1 | 0 | 0 | 0 | 0 | 0 |
| 5 | 1 | 1 | 1 | 0 | 0 | 1 | 1 | 1 | 1 | 1 | 0 | 0 | 0 |
| 6 | 1 | 0 | 0 | 1 | 0 | 1 | 0 | 1 | 1 | 1 | 0 | 0 | 1 |
| 7 | 1 | 1 | 0 | 1 | 0 | 1 | 1 | 1 | 0 | 0 | 1 | 0 | 0 |
| 8 | 1 | 0 | 1 | 1 | 0 | 1 | 0 | 0 | 1 | 0 | 0 | 1 | 0 |
| 9 | 0 | 1 | 1 | 1 | 0 | 1 | 1 | 0 | 1 | 0 | 0 | 0 | 0 |
| 10 | 0 | 0 | 0 | 0 | 1 | 1 | 0 | 0 | 0 | 0 | 1 | 0 | 0 |
| 11 | 1 | 0 | 0 | 0 | 1 | 1 | 0 | 0 | 0 | 1 | 0 | 0 | 0 |

-continued

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 12 | 0 | 0 | 1 | 0 | 1 | 1 | 0 | 0 | 1 | 1 | 0 | 0 | 0 |
| 13 | 1 | 0 | 1 | 0 | 1 | 1 | 1 | 1 | 0 | 1 | 0 | 0 | 0 |
| 14 | 0 | 1 | 1 | 0 | 1 | 1 | 0 | 1 | 1 | 0 | 0 | 0 | 0 |
| 15 | 1 | 1 | 1 | 0 | 1 | 1 | 0 | 1 | 0 | 0 | 1 | 0 | 1 |
| 16 | 1 | 0 | 0 | 1 | 1 | 1 | 1 | 1 | 0 | 1 | 1 | 0 | 0 |
| 17 | 1 | 1 | 0 | 1 | 1 | 1 | 1 | 0 | 0 | 1 | 0 | 0 | 0 |
| 18 | 0 | 0 | 1 | 1 | 1 | 1 | 0 | 1 | 0 | 1 | 1 | 0 | 0 |
| 19 | 1 | 1 | 1 | 1 | 1 | 1 | 0 | 1 | 1 | 1 | 1 | 0 | 0 |
| 20 | 0 | 0 | 0 | 0 | 0 | 1 | 0 | 0 | 0 | 0 | 0 | 0 | 0 |
| 21 | 1 | 0 | 0 | 0 | 0 | 1 | 1 | 0 | 0 | 0 | 0 | 0 | 0 |
| 22 | 0 | 0 | 0 | 1 | 0 | 1 | 0 | 0 | 0 | 1 | 1 | 0 | 0 |
| 23 | 0 | 1 | 0 | 1 | 0 | 1 | 0 | 1 | 1 | 0 | 1 | 0 | 0 |
| 24 | 0 | 0 | 1 | 1 | 0 | 1 | 1 | 0 | 1 | 1 | 0 | 0 | 0 |
| 25 | 1 | 1 | 1 | 1 | 0 | 1 | 1 | 1 | 1 | 1 | 1 | 0 | 0 |
| 26 | 0 | 1 | 0 | 0 | 1 | 1 | 0 | 0 | 1 | 1 | 1 | 0 | 0 |
| 27 | 1 | 1 | 0 | 0 | 1 | 1 | 1 | 1 | 1 | 0 | 1 | 0 | 0 |
| 28 | 0 | 0 | 0 | 1 | 1 | 1 | 0 | 0 | 1 | 0 | 1 | 0 | 0 |
| 29 | 0 | 1 | 0 | 1 | 1 | 1 | 1 | 0 | 1 | 0 | 1 | 0 | 0 |
| 30 | 1 | 0 | 1 | 1 | 1 | 1 | 0 | 1 | 0 | 1 | 0 | 0 | 0 |
| 31 | 0 | 1 | 1 | 1 | 1 | 1 | 1 | 0 | 1 | 1 | 1 | 0 | 0. |

5. The method of claim 4, wherein in a case that the length of the information bits is 1 to 3 bits, the received input signal is generated based on accumulated code symbols associated with a code symbol length determined according to the length of the information bits.

6. The method of claim 5, wherein the decoding the input signal further comprises:
applying column permutation to the received input signal multiplied by a mask sequence; and
obtaining the information bits based on a comparison on results of correlation calculation based on Reed-Muller codes.

7. The method of claim 4, wherein the decoding the input signal further comprising:
in a case that the length of the information bits is 4 to 13 bits, multiplying the received input signal by a mask sequence; and
obtaining the information bits based on a comparison on results of correlation calculation based on Reed-Muller codes.

8. An encoder configured to encode information bits, the encoder comprising:
at least one processor configured to:
identify the information bits,
encode the information bits by using a block code, and
obtain a codeword as a result of the encoding,
wherein:
a length of the information bits is a maximum of 13 bits,
the block code is composed of a Walsh basis sequence and a mask basis sequence, and
the block code is as follows:

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 1 | 1 | 0 | 0 | 0 | 1 | 1 | 1 |
| 1 | 0 | 1 | 0 | 0 | 0 | 1 | 1 | 1 | 0 | 0 | 1 | 1 | 1 |
| 2 | 1 | 0 | 1 | 0 | 0 | 1 | 1 | 0 | 0 | 1 | 1 | 0 | 0 |
| 3 | 0 | 0 | 1 | 0 | 0 | 1 | 1 | 1 | 1 | 0 | 0 | 1 | 0 |
| 4 | 0 | 1 | 1 | 0 | 0 | 1 | 0 | 1 | 0 | 0 | 0 | 0 | 0 |
| 5 | 1 | 1 | 1 | 0 | 0 | 1 | 1 | 1 | 1 | 1 | 0 | 0 | 0 |
| 6 | 1 | 0 | 0 | 1 | 0 | 1 | 0 | 1 | 1 | 1 | 0 | 0 | 1 |
| 7 | 1 | 1 | 0 | 1 | 0 | 1 | 1 | 1 | 0 | 0 | 1 | 0 | 0 |
| 8 | 1 | 0 | 1 | 1 | 0 | 1 | 0 | 0 | 1 | 0 | 0 | 1 | 0 |
| 9 | 0 | 1 | 1 | 1 | 0 | 1 | 1 | 0 | 1 | 0 | 0 | 0 | 0 |
| 10 | 0 | 0 | 0 | 0 | 1 | 1 | 0 | 0 | 0 | 0 | 1 | 0 | 0 |
| 11 | 1 | 0 | 0 | 0 | 1 | 1 | 0 | 0 | 0 | 1 | 0 | 0 | 0 |
| 12 | 0 | 0 | 1 | 0 | 1 | 1 | 0 | 0 | 1 | 1 | 0 | 0 | 0 |
| 13 | 1 | 0 | 1 | 0 | 1 | 1 | 1 | 1 | 0 | 1 | 0 | 0 | 0 |
| 14 | 0 | 1 | 1 | 0 | 1 | 1 | 0 | 1 | 1 | 0 | 0 | 0 | 0 |
| 15 | 1 | 1 | 1 | 0 | 1 | 1 | 0 | 1 | 0 | 0 | 1 | 0 | 1 |
| 16 | 1 | 0 | 0 | 1 | 1 | 1 | 1 | 1 | 0 | 1 | 1 | 0 | 0 |
| 17 | 1 | 1 | 0 | 1 | 1 | 1 | 1 | 0 | 0 | 1 | 0 | 0 | 0 |
| 18 | 0 | 0 | 1 | 1 | 1 | 1 | 0 | 1 | 0 | 1 | 1 | 0 | 0 |
| 19 | 1 | 1 | 1 | 1 | 1 | 1 | 0 | 1 | 1 | 1 | 1 | 0 | 0 |
| 20 | 0 | 0 | 0 | 0 | 0 | 1 | 0 | 0 | 0 | 0 | 0 | 0 | 0 |
| 21 | 1 | 0 | 0 | 0 | 0 | 1 | 1 | 0 | 0 | 0 | 0 | 0 | 0 |
| 22 | 0 | 0 | 0 | 1 | 0 | 1 | 0 | 0 | 0 | 1 | 1 | 0 | 0 |
| 23 | 0 | 1 | 0 | 1 | 0 | 1 | 0 | 1 | 1 | 0 | 1 | 0 | 0 |
| 24 | 0 | 0 | 1 | 1 | 0 | 1 | 1 | 0 | 1 | 1 | 0 | 0 | 0 |
| 25 | 1 | 1 | 1 | 1 | 0 | 1 | 1 | 1 | 1 | 1 | 1 | 0 | 0 |
| 26 | 0 | 1 | 0 | 0 | 1 | 1 | 0 | 0 | 1 | 1 | 1 | 0 | 0 |
| 27 | 1 | 1 | 0 | 0 | 1 | 1 | 1 | 1 | 1 | 0 | 1 | 0 | 0 |

-continued

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 28 | 0 | 0 | 0 | 1 | 1 | 1 | 0 | 0 | 1 | 0 | 1 | 0 | 0 |
| 29 | 0 | 1 | 0 | 1 | 1 | 1 | 1 | 0 | 1 | 0 | 1 | 0 | 0 |
| 30 | 1 | 0 | 1 | 1 | 1 | 1 | 0 | 1 | 0 | 1 | 0 | 0 | 0 |
| 31 | 0 | 1 | 1 | 1 | 1 | 1 | 1 | 0 | 1 | 1 | 1 | 0 | 0. |

9. The encoder of claim 8, wherein in a case that the length of the information bits is 13 bits, rows from i=0 to i=19 and columns from $M_{i,0}$ to $M_{i,12}$ in the block code are used for the encoding.

10. The encoder of claim 8, wherein in a case that the length of the information bits is 3 bits, rows from i=0 to i=6 and columns from $M_{i,0}$ to $M_{i,12}$ in the block code are used for the encoding.

11. A decoder configured to decode an input signal, the decoder comprising:
a receiver; and
at least one processor configured to:
receive the input signal,
decode the input signal based on a block code, and
obtain information bits as a result of the decoding,
wherein a length of the information bits is a maximum of 13 bits,
the block code is composed of a Walsh basis sequence and a mask basis sequence, and
the block code is as follows:

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 1 | 1 | 0 | 0 | 0 | 1 | 1 | 1 |
| 1 | 0 | 1 | 0 | 0 | 0 | 1 | 1 | 1 | 0 | 0 | 0 | 1 | 1 |
| 2 | 1 | 0 | 1 | 0 | 0 | 1 | 1 | 0 | 0 | 1 | 1 | 0 | 0 |
| 3 | 0 | 0 | 1 | 0 | 0 | 1 | 1 | 1 | 1 | 0 | 0 | 1 | 0 |
| 4 | 0 | 1 | 1 | 0 | 0 | 1 | 0 | 1 | 0 | 0 | 0 | 0 | 0 |
| 5 | 1 | 1 | 1 | 0 | 0 | 1 | 1 | 1 | 1 | 0 | 0 | 0 | 0 |
| 6 | 1 | 0 | 0 | 1 | 0 | 1 | 0 | 1 | 1 | 1 | 0 | 0 | 1 |
| 7 | 1 | 1 | 0 | 1 | 0 | 1 | 1 | 1 | 0 | 1 | 0 | 0 | 0 |
| 8 | 1 | 0 | 1 | 1 | 0 | 1 | 0 | 0 | 1 | 0 | 0 | 1 | 0 |
| 9 | 0 | 1 | 1 | 1 | 0 | 1 | 1 | 0 | 1 | 0 | 0 | 0 | 0 |
| 10 | 0 | 0 | 0 | 0 | 1 | 1 | 0 | 0 | 0 | 0 | 1 | 0 | 0 |
| 11 | 1 | 0 | 0 | 0 | 1 | 1 | 0 | 0 | 0 | 1 | 0 | 0 | 0 |
| 12 | 0 | 0 | 1 | 0 | 1 | 1 | 0 | 0 | 1 | 1 | 0 | 0 | 0 |
| 13 | 1 | 0 | 1 | 0 | 1 | 1 | 1 | 1 | 0 | 1 | 0 | 0 | 0 |
| 14 | 0 | 1 | 1 | 0 | 1 | 1 | 0 | 1 | 1 | 0 | 0 | 0 | 0 |
| 15 | 1 | 1 | 1 | 0 | 1 | 1 | 0 | 1 | 0 | 0 | 1 | 0 | 1 |
| 16 | 1 | 0 | 0 | 1 | 1 | 1 | 1 | 0 | 1 | 1 | 0 | 0 | 0 |
| 17 | 1 | 1 | 0 | 1 | 1 | 1 | 1 | 0 | 0 | 1 | 0 | 0 | 0 |
| 18 | 0 | 0 | 1 | 1 | 1 | 1 | 0 | 1 | 0 | 1 | 1 | 0 | 0 |
| 19 | 1 | 1 | 1 | 1 | 1 | 1 | 0 | 1 | 1 | 1 | 1 | 0 | 0 |
| 20 | 0 | 0 | 0 | 0 | 0 | 1 | 0 | 0 | 0 | 0 | 0 | 0 | 0 |
| 21 | 1 | 0 | 0 | 0 | 0 | 1 | 1 | 0 | 0 | 0 | 0 | 0 | 0 |
| 22 | 0 | 0 | 0 | 1 | 0 | 1 | 0 | 0 | 0 | 1 | 1 | 0 | 0 |
| 23 | 0 | 1 | 0 | 1 | 0 | 1 | 0 | 1 | 1 | 0 | 1 | 0 | 0 |
| 24 | 0 | 0 | 1 | 1 | 0 | 1 | 1 | 0 | 1 | 1 | 0 | 0 | 0 |
| 25 | 1 | 1 | 1 | 1 | 0 | 1 | 1 | 1 | 1 | 1 | 0 | 0 | 0 |
| 26 | 0 | 1 | 0 | 0 | 1 | 1 | 0 | 0 | 1 | 1 | 1 | 0 | 0 |
| 27 | 1 | 1 | 0 | 0 | 1 | 1 | 1 | 1 | 0 | 1 | 0 | 0 | 0 |
| 28 | 0 | 0 | 0 | 1 | 1 | 1 | 0 | 0 | 1 | 0 | 1 | 0 | 0 |
| 29 | 0 | 1 | 0 | 1 | 1 | 1 | 1 | 0 | 1 | 0 | 1 | 0 | 0 |
| 30 | 1 | 0 | 1 | 1 | 1 | 1 | 0 | 1 | 0 | 1 | 0 | 0 | 0 |
| 31 | 0 | 1 | 1 | 1 | 1 | 1 | 1 | 0 | 1 | 1 | 1 | 0 | 0. |

12. The decoder of claim 11, wherein in a case that the length of the information bits is 1 to 3 bits the received input signal is generated based on accumulated code symbols associated with a code symbol length determined according to the length of the information bits.

13. The decoder of claim 12, wherein the at least one processor is further configured to:

apply column permutation to the received input signal multiplied by a mask sequence, and
obtain the information bits based on a comparison on results of correlation calculation based on Reed-Muller codes.

14. The decoder of claim 11, wherein the at least one processor is further configured to:
in a case that the length of the information bits is 4 to 13 bits, multiply the received input signal by a mask sequence, and
obtain the information bits based on a comparison on results of correlation calculation based on Reed-Muller codes.

15. The method of claim 1, wherein in a case that the length of the information bits is 11 bits, rows from i=0 to i=31 and columns from $M_{i,0}$ to $M_{i,10}$ in the block code are used for the encoding.

16. The method of claim 1, wherein a code symbol $C_i$ in the codeword is identified based on following equation:

$$C_i = \sum_{n=0}^{k-1} a_n \cdot M_{t,n},$$

i=0, 1, 2, ..., B−1, t=i mod ($2^k$−1) in case of k<4, t=i in case of k≥4, where k is a number of information bits $a_n$, B is a number of code symbols, $M_{t,n}$ is a column of the block code.

17. The encoder of claim 8, wherein in a case that the length of the information bits is 11 bits, rows from i=0 to i=31 and columns from $M_{i,0}$ to $M_{i,10}$ in the block code are used for the encoding.

18. The encoder of claim 8, wherein a code symbol $C_i$ in the codeword is identified based on following equation:

$$C_i = \sum_{n=0}^{k-1} a_n \cdot M_{t,n},$$

i=0, 1, 2, ..., B−1, t=i mod ($2^k$−1) in case of k<4, t=i in case of k≥4, where k is a number of information bits $a_n$, B is a number of code symbols, $M_{t,n}$ is a column of the block code.

* * * * *